United States Patent
Yokoyama et al.

(10) Patent No.: US 11,538,894 B2
(45) Date of Patent: Dec. 27, 2022

(54) DISPLAY DEVICE WITH OVERLAPPED WIRING LINES AT PERIPHERY OF CUTOUT REGION

(71) Applicant: SHARP KABUSHIKI KAISHA, Sakai (JP)

(72) Inventors: Makoto Yokoyama, Sakai (JP); Junichi Yamada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 208 days.

(21) Appl. No.: 17/042,852

(22) PCT Filed: Mar. 30, 2018

(86) PCT No.: PCT/JP2018/013973
§ 371 (c)(1),
(2) Date: Sep. 28, 2020

(87) PCT Pub. No.: WO2019/187151
PCT Pub. Date: Oct. 3, 2019

(65) Prior Publication Data
US 2021/0020734 A1    Jan. 21, 2021

(51) Int. Cl.
*H01L 27/32* (2006.01)

(52) U.S. Cl.
CPC .................. *H01L 27/3276* (2013.01)

(58) Field of Classification Search
CPC .................................. H01L 27/3276
See application file for complete search history.

(56) References Cited

U.S. PATENT DOCUMENTS

| | | | |
|---|---|---|---|
| 2008/0251787 A1* | 10/2008 | Kim | H01L 22/32 257/48 |
| 2010/0156945 A1 | 6/2010 | Yoshida | |
| 2012/0112988 A1 | 5/2012 | Nakanishi et al. | |
| 2014/0034923 A1 | 2/2014 | Kim et al. | |
| 2017/0287992 A1 | 10/2017 | Kwak et al. | |
| 2017/0288002 A1* | 10/2017 | Kim | H01L 51/0097 |
| 2017/0294502 A1* | 10/2017 | Ka | H01L 27/3276 |
| 2018/0129106 A1* | 5/2018 | Gao | G09G 3/3648 |
| 2018/0151663 A1* | 5/2018 | Kim | G09G 3/3233 |
| 2019/0019789 A1* | 1/2019 | Kim | H01L 27/0296 |
| 2019/0181213 A1* | 6/2019 | Lim | G09G 3/3225 |

FOREIGN PATENT DOCUMENTS

| | | |
|---|---|---|
| JP | 2012-103335 A | 5/2012 |
| JP | 2014-032379 A | 2/2014 |
| WO | 2008/062575 A1 | 5/2008 |

* cited by examiner

*Primary Examiner* — Lex H Malsawma
(74) *Attorney, Agent, or Firm* — ScienBiziP, P.C.

(57) ABSTRACT

A first metal layer, an inorganic insulating film, and a second metal layer are provided. A first wiring line led to a peripheral edge of a cutout portion is provided in the first metal layer. A second wiring line led to the peripheral edge of the cutout portion is provided in the second metal layer. The first lead wiring line and the second lead wiring line overlap each other through intermediation of the inorganic insulating film.

20 Claims, 16 Drawing Sheets

DISPLAY DEVICE WITH OVERLAPPED WIRING LINES AT PERIPHERY OF CUTOUT REGION

TECHNICAL FIELD

The disclosure relates to a display device.

SUMMARY

Technical Problem

PTL 1 discloses a technique of suppressing luminance unevenness of a display region having an irregular shape (a shape including a corner cut out).

CITATION LIST

Patent Literature

PTL 1: JP 2012-103335 A (published May 31, 2012)

SUMMARY OF INVENTION

Technical Problem

In the related art described above, there is a problem in a shape of the display region that is limited to a specific shape.

Solution to Problem

A display device according to an aspect of the disclosure includes a display region in which a cutout portion is formed, and a frame region, wherein the display region includes a plurality of data signal lines configured to transmit a data signal, a plurality of scanning signal lines intersecting the plurality of data signal lines, a plurality of light emission control signal lines, and a plurality of subpixel circuits being provided correspondingly to intersection points of the plurality of data signal lines and the plurality of scanning signal lines, the display device is provided with a drive circuit being electrically coupled to the plurality of data signal lines, a drive circuit being electrically coupled to the plurality of scanning signal lines, and a drive circuit being electrically coupled to the plurality of light emission control signal lines, the frame region in a periphery of the cutout portion includes a first lead wiring lines being electrically coupled to a first signal line as one of the plurality of data signal lines, or one of the plurality of scanning signal lines, or one of the plurality of light emission control signal lines, and extending from the display region to the cutout portion, and a second lead wiring line being electrically coupled to a second signal line as another one of the plurality of data signal lines, or another one of the plurality of scanning signal lines, or another one of the plurality of light emission control signal lines, and extending from the display region to the cutout portion, the second signal line being adjacent to the first signal line, the first lead wiring line is provided in a first metal layer, the second lead wiring line is provided in a second metal layer being different from the first metal layer, and the first lead wiring line and the second lead wiring line are superposed on each other through intermediation of an inorganic insulating film.

Advantageous Effects of Disclosure

According to an aspect of the disclosure, luminance unevenness of a display region in which a cutout is formed can be improved.

DESCRIPTION OF EMBODIMENTS

Hereinafter, the "same layer" means that a layer is formed in the same process (film formation step), a "lower layer" means that a layer is formed in a previous process to a process in which a layer for comparison is formed, and an "upper layer" means that a layer is formed in a subsequent process to a process in which a layer for comparison is formed.

Figure 1:
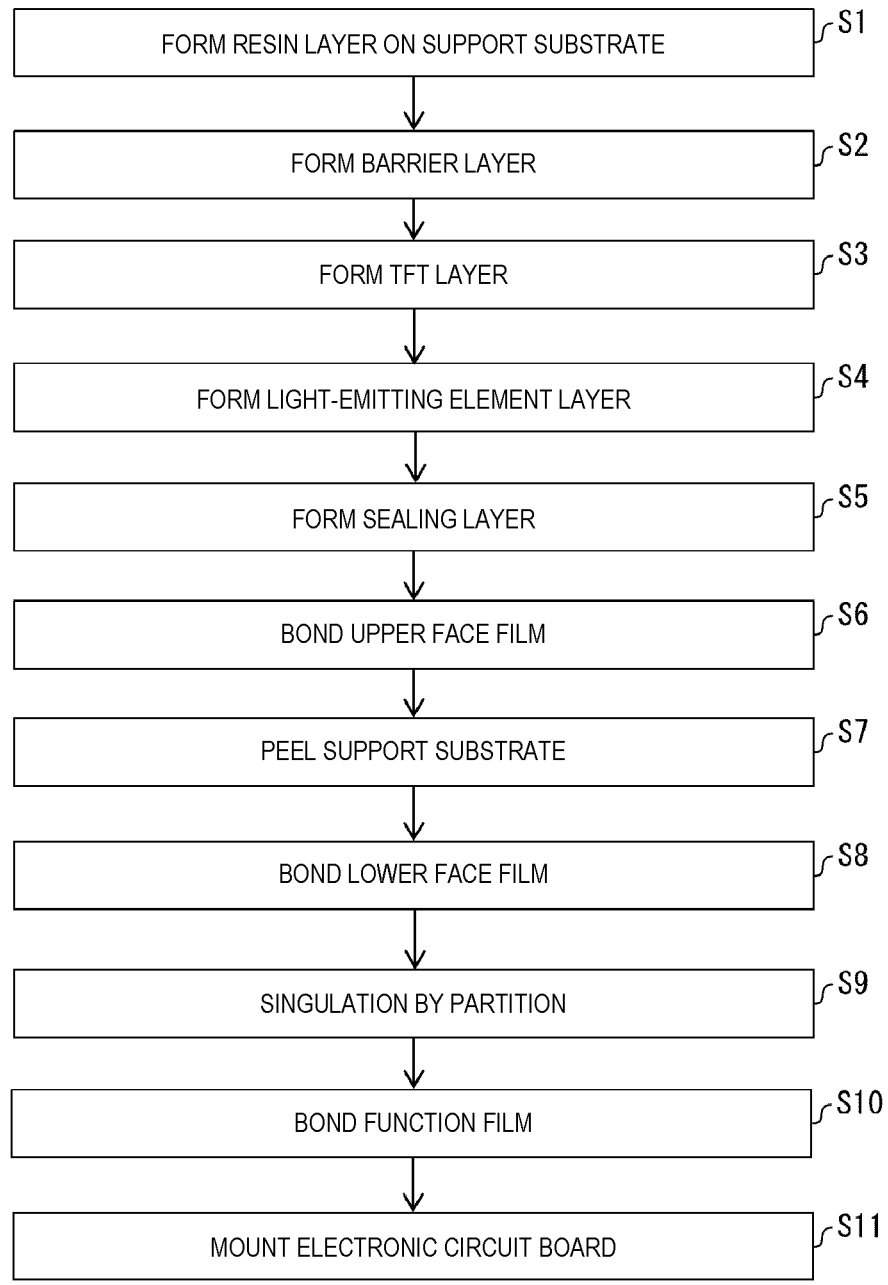
FIG. 1 is a flowchart illustrating an example of a method of manufacturing a display device.
Figure 2:
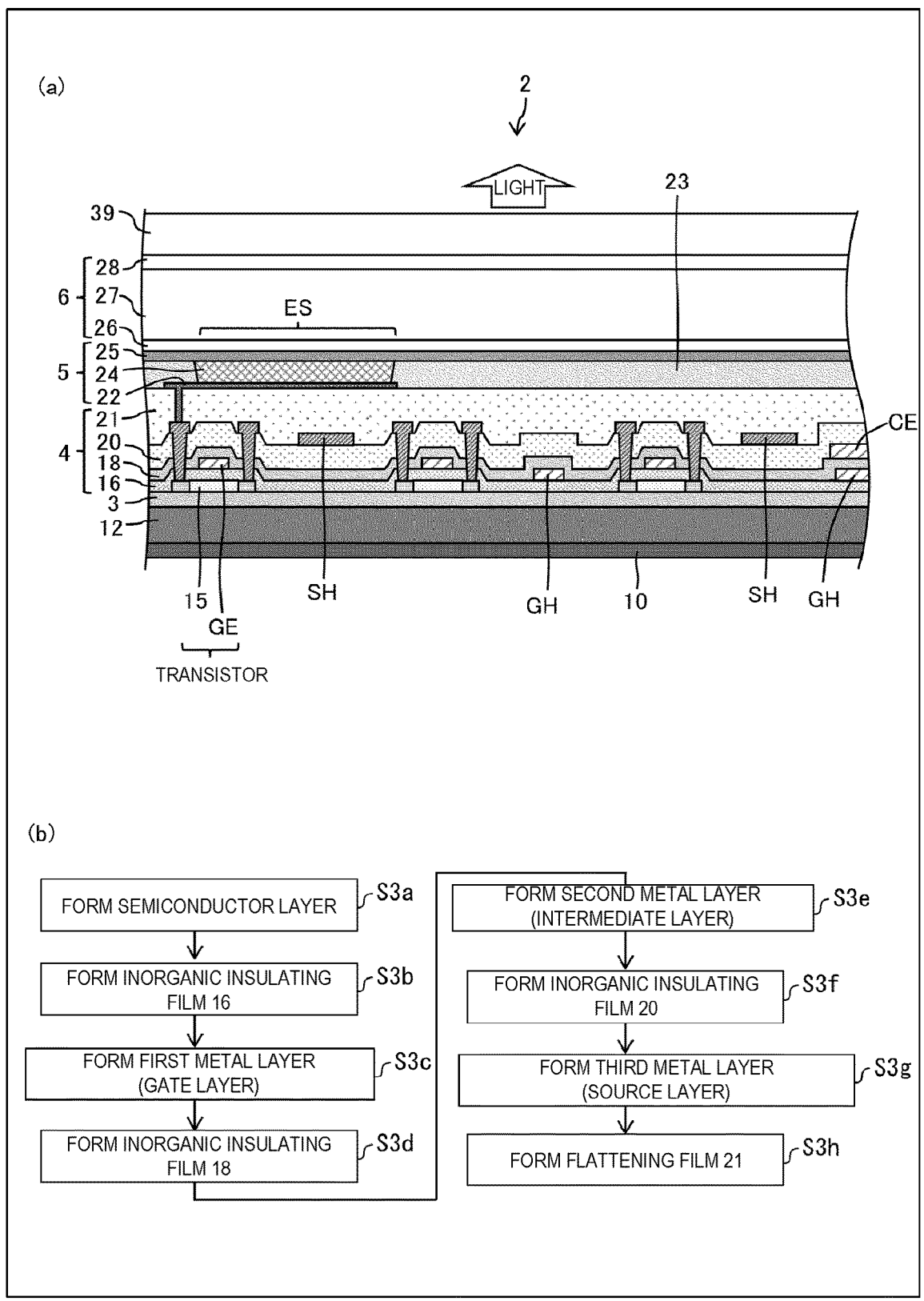
FIG. 2(a) is a cross-sectional view illustrating a configuration example of a display region of a display device, and (b) is a flowchart illustrating an example of a step of forming a TFT layer.

FIG. 1 is a flowchart illustrating an example of a method of manufacturing a display device. FIG. 2 is a cross-sectional view illustrating a configuration example of a display portion of the display device.

In a case where a flexible display device is manufactured, as illustrated in FIG. 1 and FIG. 2, first, a resin layer 12 is formed on a light-transmitting support substrate (mother glass, for example) (step S1). Then, a barrier layer 3 is formed (step S2). Then, a TFT layer 4 is formed (step S3). Then, a light-emitting element layer 5 of a top-emitting type is formed (step S4). Then, a sealing layer 6 is formed (step S5). Then, an upper face film is bonded on the sealing layer 6 (step S6).

Then, the support substrate is peeled from the resin layer 12 by irradiation of laser light or the like (step S7). Then, a lower face film 10 is bonded to a tower face of the resin layer 12 (step S8). Then, a layered body including the lower face film 10, the resin layer 12, the barrier layer 3, the TFT layer 4, the light-emitting element layer 5, and the sealing layer 6 is partitioned and a plurality of individual pieces are obtained (step S9). Then, a function film 39 is bonded to the obtained individual pieces (step S10). Then, an electronic circuit board (for example, an IC chip and an FPC) is mounted on a portion (terminal section) in an outer side (a non-display region, a frame edge) with respect to a display region in which a plurality of subpixels are formed (step S11). Note that steps S1 to S11 are performed by a display device manufacturing apparatus (including a film formation apparatus performing each step of steps S1 to S5).

Examples of a material of the resin layer 12 include polyimide. As illustrated in FIG. 2(b), a portion corresponding to the resin layer 12 may be replaced with two resin films (for example, polyimide films) and an inorganic insulating film sandwiched between the resin films.

The barrier layer 3 is a layer that prevents foreign matters such as water and oxygen from entering the TFT layer 4 and the light-emitting element layer 5, and can include a silicon oxide film, a silicon nitride film, or a silicon oxynitride film, or a layered film of these, formed by CVD.

The TFT layer 4 includes a semiconductor film 15, an inorganic insulating film 16 (gate insulating film) that is an upper layer overlying the semiconductor film 15, a gate electrode GE and a gate wiring line GH that are upper layers overlying the inorganic insulating film 16, an inorganic insulating film 18 that is an upper layer overlying the gate electrode GE and the gate wiring line GH, a capacitance electrode CE that is an upper layer overlying the inorganic insulating film 18, an inorganic insulating film 20 that is an upper layer overlying the capacitance electrode CE, a source wiring line SH that is an upper layer overlying the inorganic insulating film 20, and a flattening film 21 that is an upper layer overlying the source wiring line SH.

The semiconductor film 15 includes, for example, a low-temperature polysilicon (LTPS) or an oxide semiconductor (for example, an In—Ga—Zn—O based semiconductor), and a transistor (TFT) is constituted to include the semiconductor film 15 and the gate electrode GE. The transistor is illustrated as a top gate structure in FIG. 2. However, the transistor may include a bottom gate structure.

The gate electrode GE, the gate wiring line GH, the capacitance electrode CE, and the source wiring line SH each include a single layer film or a layered film of a metal, for example, including at least one of aluminum, tungsten, molybdenum, tantalum, chromium, titanium, and copper.

As illustrated in FIG. 2, the TFT layer 4 includes a first metal layer (gate layer) formed at step S3c, a second metal layer (intermediate layer) formed at step S3e, and a third metal layer (source layer) formed at step S3g.

Each of the inorganic insulating films 16, 18, and 20 can includes, for example, a silicon oxide (SiOx) film or a silicon nitride (SiNx) film, or a layered film of these, formed by CVD. The flattening film 21 can include, for example, a coatable organic material such as polyimide and acrylic.

The light-emitting element layer 5 includes an anode 22 that is an upper layer overlying the flattening film 21, an edge cover 23 having insulating properties and covering an edge of the anode 22, an electroluminescence (EL) layer 24 that is an upper layer overlying the edge cover 23, and a cathode 25 that is an upper layer overlying the EL layer 24. The edge cover 23 is formed by applying an organic material such as polyimide and acrylic and then by patterning the organic material by photolithography, for example.

A light-emitting element ES (for example, an organic light emitting diode (OLED), a quantum dot light emitting diode (QLED)) including the anode 22, the EL layer 24, and the cathode 25 in island shapes is formed for each subpixel in the light-emitting element layer 5. A control circuit of the light-emitting element ES is formed in the TFT layer 4, and the light-emitting element and the control circuit of the light-emitting element constitute a subpixel circuit.

For example, the EL, layer 24 is constituted by layering a hole injection layer, a hole transport layer, a light-emitting layer, an electron transport layer, and an electron injection layer in this order, from the lower layer side. The light-emitting layer is formed in an island shape in an opening (for each subpixel) of the edge cover 23 by vapor deposition or an ink-jet method. Other layers are formed in an island shape or a solid-like shape (common layer). Additionally, a configuration in which one or more layers of the hole injection layer, the hole transport layer, the electron transport layer, and the electron injection layer are not formed is also possible.

In a case where a light-emitting layer of an OLED is formed by vapor deposition, an fine metal mask (FMM) is used. The FMM is a sheet including a number of openings (formed of, for example, an invar material), and an organic material passing through one opening form a light-emitting layer having an island shape (corresponding to one subpixel).

Regarding a light-emitting layer of a QLED, for example, a light-emitting layer having an island shape (corresponding to one subpixel) can be formed by applying a solvent in which quantum dots are dispersed, by ink-jet.

The anode (anode electrode) 22 is constituted by layering of, for example, Indium Tin Oxide (ITO) and silver (Ag) or an alloy including Ag, and has light reflectivity. The cathode (cathode electrode) 25 can include a light-transmitting conductive material such as a MgAg alloy (extremely thin film), ITO, or Indium Zinc Oxide (IZO).

In a case where the light-emitting element ES is an OLED, a positive hole and an electron recombine inside the light-emitting layer due to a drive current between the anode 22 and the cathode 25, and light is emitted in a process where an exciton generated by the recombination transits to a ground state. Since the cathode 25 is light-transmitting and the anode 22 has light reflectivity, light emitted from the EL layer 24 travels upward and top-emitting is achieved.

In a case where the light-emitting element ES is a QLED, a positive hole and an electron recombine inside the light-emitting layer due to a drive current between the anode 22 and the cathode 25, and light (fluorescence) is emitted in a process where an exciton generated by the recombination transits from a conduction band level to a valence band level of a quantum dot.

A light-emitting element (inorganic light emitting diode or the like) other than the OLED and the QLED described above may be formed in the light-emitting element layer 5.

The sealing layer 6 is light-transmitting, and includes an inorganic sealing film 26 covering the cathode 25, an organic buffer film 27 that is an upper layer overlying the inorganic sealing film 26, and an inorganic sealing film 28 that is an upper layer overlying the organic buffer film 27. The seating layer 6 covering the light-emitting element layer 5 prevents foreign matters such as water and oxygen from penetrating the light-emitting element layer 5.

Each of the inorganic sealing film 26 and the inorganic sealing film 28 is an inorganic insulating film, and can include, for example, a silicon oxide film, a silicon nitride film, or a silicon oxynitride film, or a layered film of these, formed by CVD. The organic buffer film 27 is a light-transmitting organic film having a flattening effect, and can include a coatable organic material such as acrylic. The organic buffer film 27 can be formed by ink-jet application, for example, and a bank for stopping droplets may be provided in a non-display region.

The lower face film 10 is, for example, a PET film bonded to a lower face of the resin layer 12 after the support substrate is peeled, to realize a display device having excellent flexibility. The function film 39 has at least one of an optical compensation function, a touch sensor function, and a protection function, for example.

The flexible display device is described above. However, in the case of manufacturing a non-flexible display device, since a resin layer is not required to be formed and a substrate is not required to be replaced in general, a layering step of steps S2 to S5 is performed on a glass substrate, and subsequently the process proceeds to step S9, for example.

First Embodiment

Figure 3:
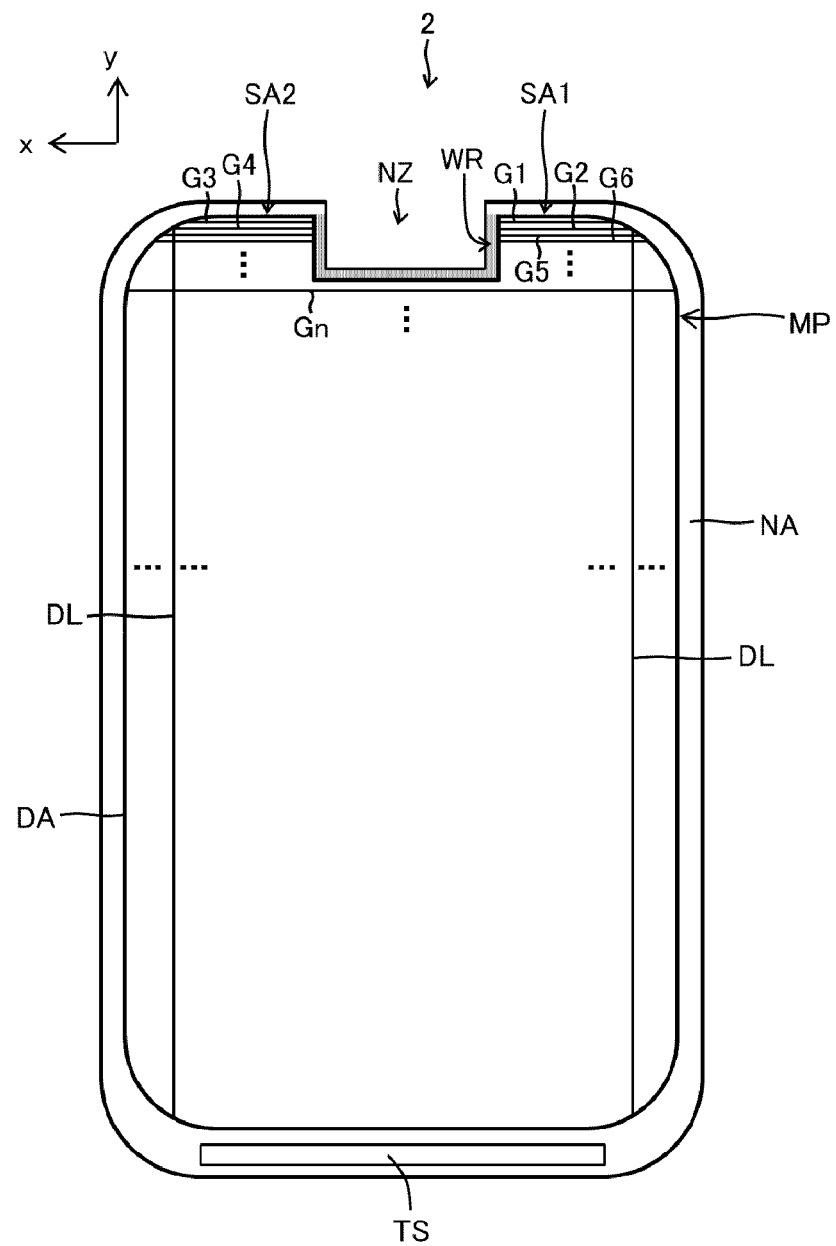
FIG. 3 is a plan view illustrating a display device of a first embodiment.
Figure 4:
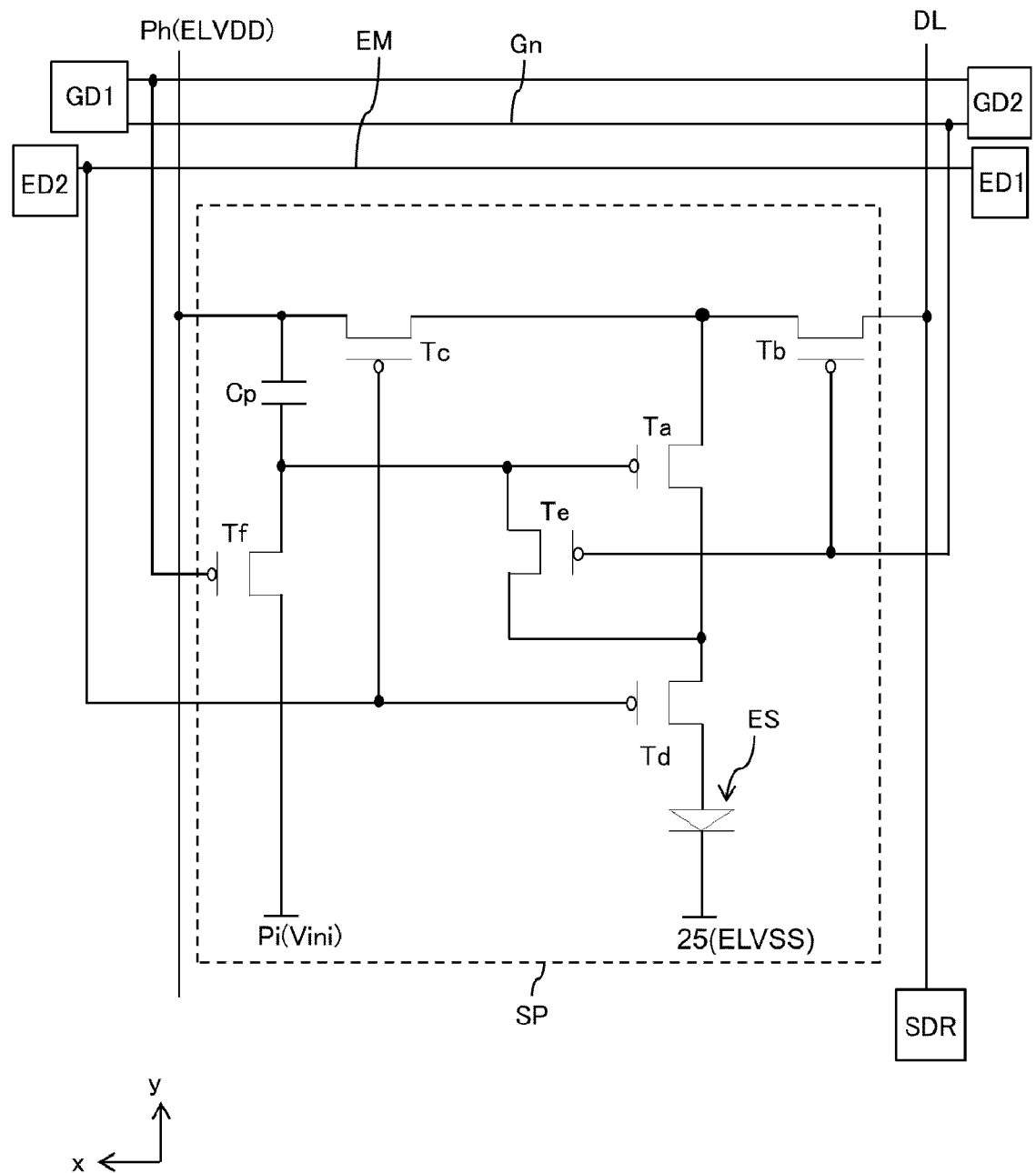
FIG. 4 is a circuit diagram illustrating a configuration example of a subpixel provided in a display region.

FIG. 3 is a plan view illustrating a display device of a first embodiment. FIG. 4 is a circuit diagram illustrating a configuration example of a subpixel provided in a display region. FIG. 5(a) is a plan view of a periphery of a cutout portion. FIG. 5(b) is a cross-sectional view taken along b-b of (a). FIGS. 6(a) to (d) are cross-sectional views each including a relay electrode.

Figure 5:
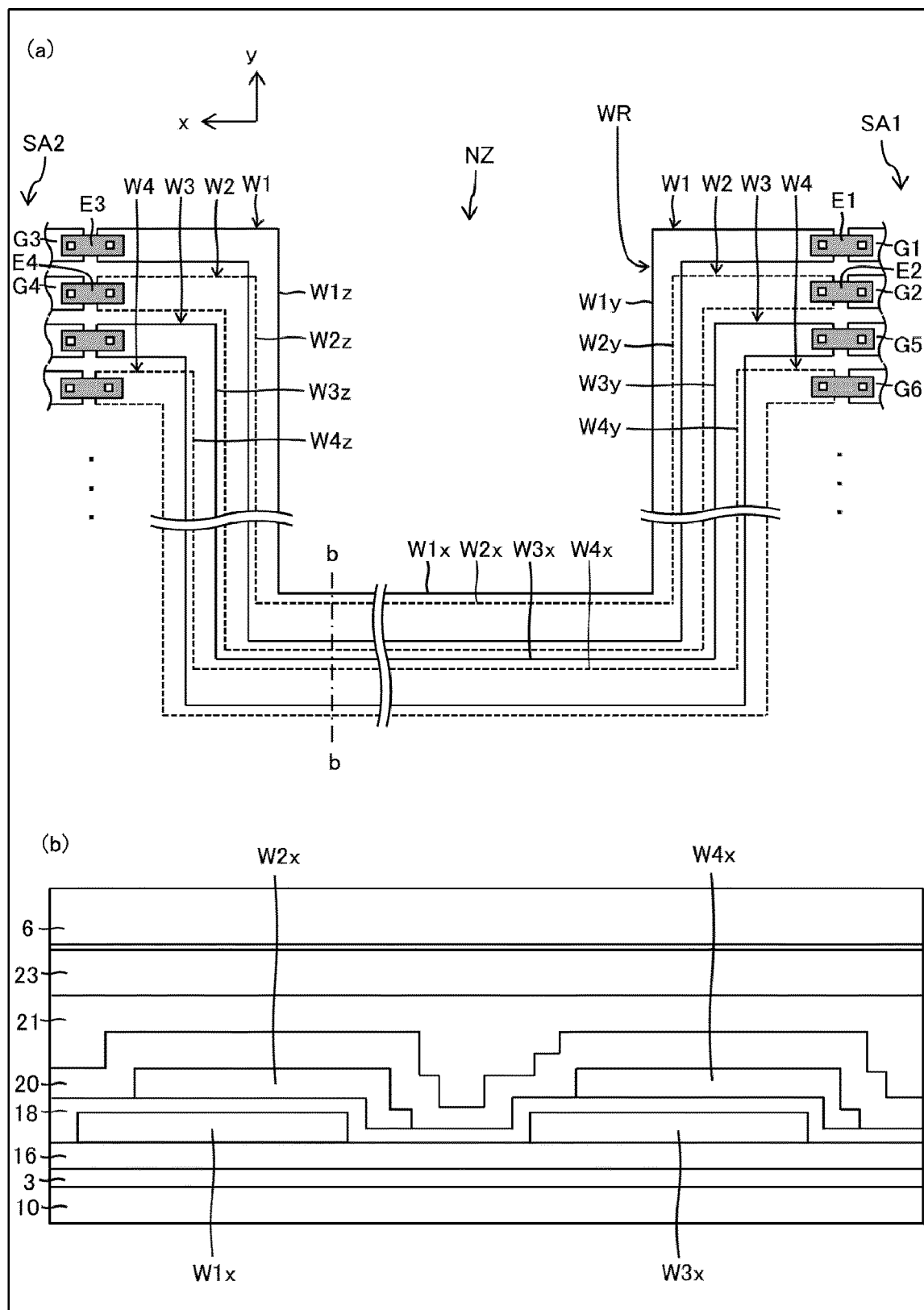
FIG. 5(a) is a plan view of a periphery of a cutout portion, and (b) is a cross-sectional view taken along b-b of (a).

As illustrated in FIG. 3 to FIG. 5, a cutout portion NZ is formed in a display region DA of a display device 2. The display region DA includes a display zone SA1 (first display zone) positioned in one side (the right side in FIG. 3) of the cutout portion NZ and a display zone SA2 (second display zone) positioned in the other side (the left side in FIG. 3). A plurality of subpixels are provided in each of the display zones SA1 and SA2. As illustrated in FIG. 4, a light-emitting element ES (for example, an OLED) and a control circuit (formed in the TFT layer 4 of FIG. 2) of the light-emitting element ES constitute a subpixel SP.

The subpixel SP is coupled to a data signal line DL, a scanning signal line Gn, a light emission control signal line EM, a high voltage power source line Ph, and an initialization power source line Pi, for example. Note that one electrode of a capacitance Cp is coupled to the high voltage power source line Ph, and the other electrode is coupled to a gate terminal of a drive transistor Ta. The drive transistor Ta includes a gate terminal coupled to the scanning signal line Gn, a source terminal coupled to the data signal line DL via a write transistor Tb, and a drain terminal coupled to the light-emitting element ES via a transistor Td. The data signal line DL is coupled to a source driver SDR (drive circuit), the scanning signal line Gn is coupled to gate drivers (drive circuits) GD1 and GD2, and the light emission control signal line EM is coupled to emission drivers ED1 and ED2 (drive circuits). The gate drivers GD1 and GD2 and the emission drivers ED1 and ED2 are formed monolithically in the TFT layer 4 provided in a frame region (non-display region) NA.

The gate drivers GD1 and GD2 are disposed to face each other and sandwich the display region DA.

The display device 2 is provided with signal lines G1 to G5 and Gn extending in an x direction and the data signal line DL extending in a y direction. The signal lines G1, G2, G5, and G6 pass through the display zone SA1, the signal lines G3 and G4 pass through the display zone SA2, and the signal line Gn passes through a main region MP in an inner side (a lower side in FIG. 3) with respect to the cutout portion NZ. Note that a terminal section TS for inputting an external signal is provided along one of two sides (short sides) of the display device 2 that face each other, and the cutout portion NZ is provided along the other. In the following description, a first lead wiring line W1 to a tenth lead wiring line W10 are abbreviated to lead wiring lines W1 to W10, respectively. Additionally, the first signal line G1 to the fourth signal line G4 are abbreviated to signal lines G1 to G4, respectively.

The data signal line DL, is a data signal line that supplies a signal voltage to the plurality of coupled subpixels. The signal lines G1, G2, G5, and G6 are scanning signal lines that supply a scanning pulse to the plurality of subpixels in the display zone SA1, the signal lines G3 and G4 are scanning signal lines that supply a scanning pulse to the plurality of subpixels in the display zone SA2, and the signal line Gn is a scanning signal line that supplies a scanning pulse to the plurality of subpixels in the main region MP. The signal lines G1 to G6 and Gn are formed in the first metal layer (gate layer) of FIG. 2(b), and the data signal line DL is formed in the third metal layer (source layer) of FIG. 2(b).

As illustrated in FIG. 5, a peripheral edge WR of the cutout portion NZ (a frame region in a periphery of the cutout portion NZ) is provided with the lead wiring line W1 electrically coupled to the signal lines G1 and G3, the lead wiring line W2 electrically coupled to the signal lines G2 and G4, the lead wiring line W3 electrically coupled to the signal line G5, and the lead wiring line W4 electrically coupled to the signal line G6. The signal lines G1, G2, G5, and G6 are coupled to the gate driver GD1 (FIG. 4), and the signal lines G3 and G4 are coupled to the gate driver GD2.

The lead wiring lines W1 and W3 are formed in the first metal layer (gate layer). the lead wiring lines W2 and W4 are formed in the second metal layer (intermediate layer) of FIG. 2 (that is, the lead wiring lines W2 and W4 are positioned in an upper layer overlying the lead wiring lines W1 and W3). The lead wiring lines W1 to W4 each have a bypassing shape for avoiding the cutout portion NZ, and a camera lens, a sensor, or the like may be disposed to be superposed on the cutout portion NZ.

Figure 6:
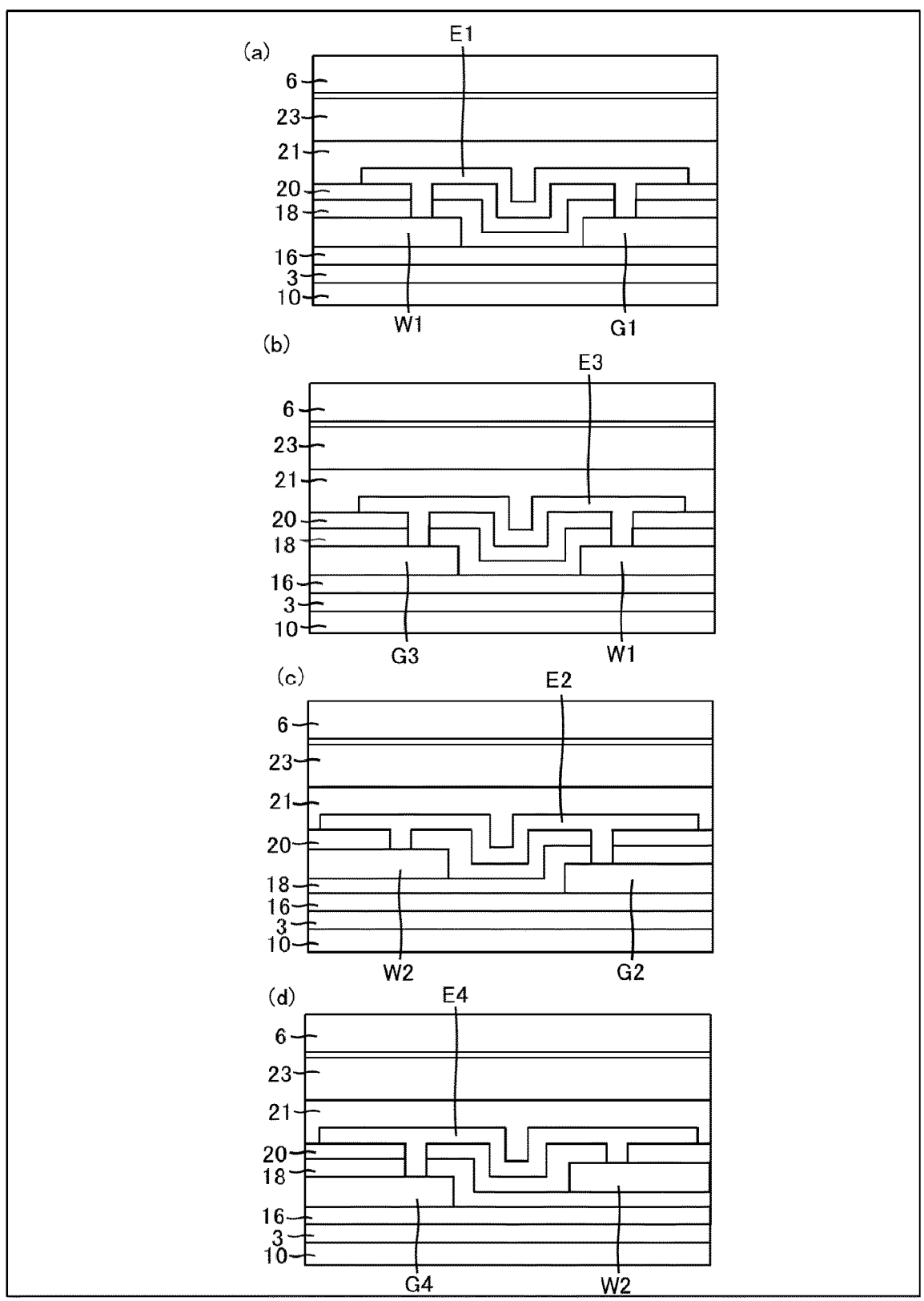
FIGS. 6(a) to (d) are cross-sectional views each including a relay electrode.

As illustrated in FIG. 6, the lead wiring line W1 and the signal line G1 are electrically coupled to each other via two contact holes and a relay electrode E1, the lead wiring line W2 and the signal line G2 are electrically coupled to each other via two contact holes and a relay electrode E2, the lead wiring line W1 and the signal line G3 are electrically coupled to each other via two contact holes and a relay electrode E3, and the lead wiring line W2 and the signal line G4 are electrically coupled to each other via two contact holes and a relay electrode E4. The relay electrodes E1 to E4 are formed in the third metal layer (source layer) of FIG. 2.

The lead wiring line W1 includes bypass portions W1$x$, W1$y$, and W1$z$ that are positioned in the peripheral edge WR of the cutout portion NZ. The bypass portion W1$x$ extends in the x direction, and the bypass portions W1$y$ and W1$z$ extend in the y direction (the direction perpendicular to the x direction). The lead wiring line W2 includes bypass portions W2$x$, W2$y$, and W2$z$ that are positioned in the peripheral edge WR of the cutout portion NZ. The bypass portion W2x extends in the x direction, and the bypass portions W2y and W2z extend in the y direction. The lead wiring line W3 includes bypass portions W3x, W3y, and W3z that are positioned in the peripheral edge WR of the cutout portion NZ. The bypass portion W3x extends in the x direction, and the bypass portions W3y and W3z extend in the y direction. The lead wiring line W4 includes bypass portions W4x, W4y, and W4z that are positioned in the peripheral edge WR of the cutout portion NZ. The bypass portion W4x extends in the x direction, and the bypass portions W4y and W4z extend in the y direction.

As illustrated in FIG. 5, in the first embodiment, the bypass portion W1x and the bypass portion W2x that extend in the x direction overlap each other through intermediation of an inorganic insulating film 18. The bypass portion W1y and the bypass portion W2y that extend in the y direction overlap each other through intermediation of the inorganic insulating film 18. The bypass portion W1z and the bypass portion W2z that extend in the y direction overlap each other through intermediation of the inorganic insulating film 18. Additionally, the bypass portion W3x and the bypass portion W4x that extend in the x direction overlap each other through intermediation of the inorganic insulating film 18. The bypass portion W3y and the bypass portion W4y that extend in the y direction overlap each other through intermediation of the inorganic insulating film 18. The bypass portion W3z and the bypass portion W4z that extend in the y direction overlap each other through intermediation of the inorganic insulating film 18. Note that "overlap (superpose)" indicates a state of overlapping (superposing) in a plan view.

Accordingly, capacity between the bypass portions W1x and W2x, capacity between the bypass portions W1y and W2y, and capacity between the bypass portions W1z and W2z can be applied to each of the lead wiring line W1 coupled to the signal lines G1 and G3 and the lead wiring line W2 coupled to the signal lines G2 and G4.

Figure 7:
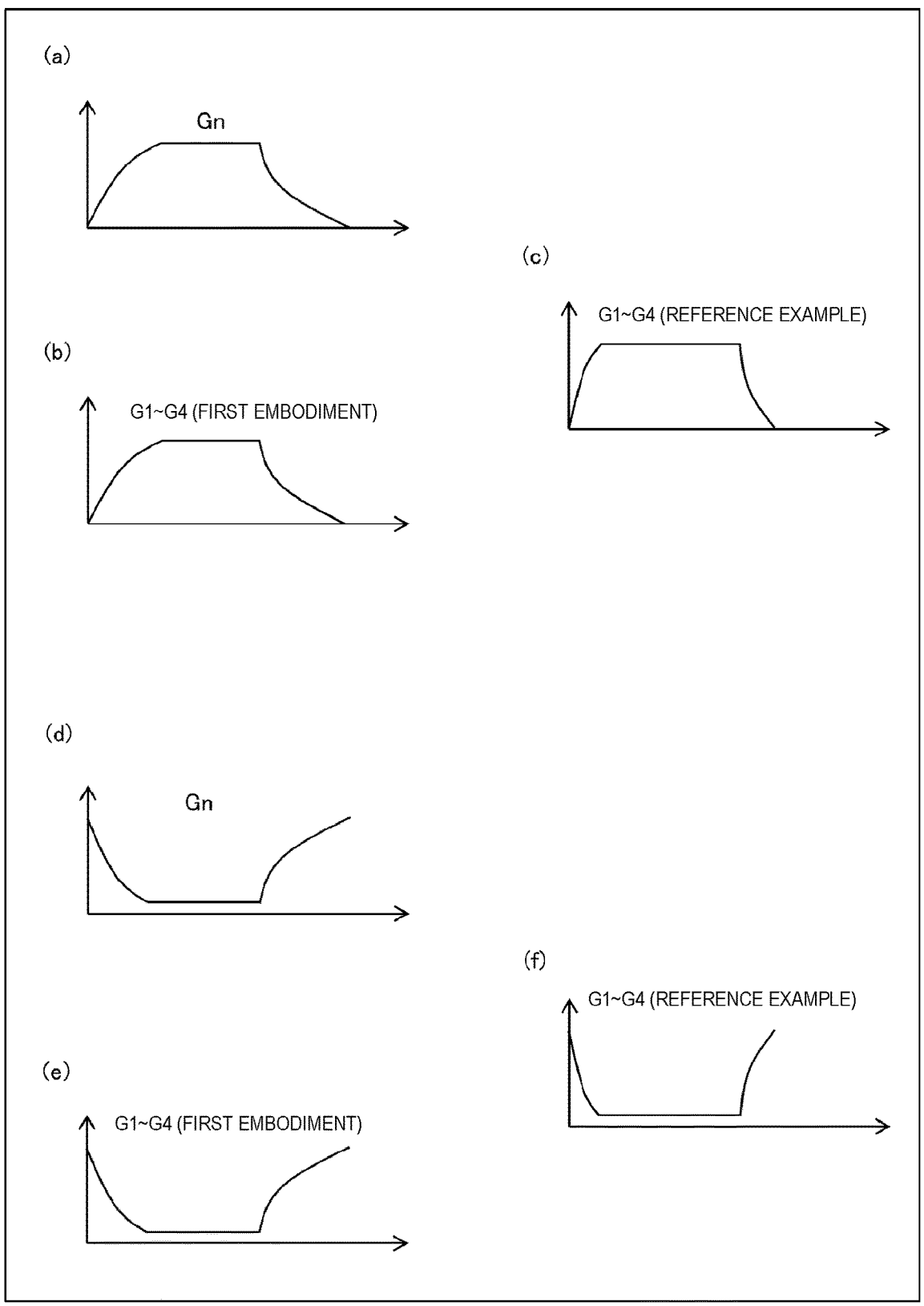
FIGS. 7(a) and (b) are schematic views each illustrating a scanning pulse (active High) in the first embodiment, (c) is a schematic view illustrating a scanning pulse in a reference example, (d) and (e) are schematic views each illustrating another scanning pulse (active Low) in the first embodiment, and (f) is a schematic view illustrating another scanning pulse in the reference example.

FIGS. 7(a) and (b) are schematic views each illustrating a scanning pulse (active High) in the first embodiment. FIG. 7(c) is a schematic view illustrating a scanning pulse in a reference example. FIGS. 7(d) and (e) are schematic views each illustrating another scanning pulse (active Low) in the first embodiment. FIG. 7(f) is a schematic view illustrating another scanning pulse in the reference example. In each of the signal lines G1 to G4, the number of coupled subpixels and the number of the data signal lines DL intersecting are less than those in the signal line Gn passing through the main region. However, when the capacity of the lead wiring lines W1 and W2 is applied, a load of the signal line Gn passing through the main region MP, a load of a channel including the signal lines G1 and G3 and the lead wiring line W1, and a load of a channel including the signal lines G2 and G4 and the lead wiring line W2 can match.

Accordingly, a waveform of a scanning pulse in the signal line Gn FIG. 7(a)) and a waveform of a scanning pulse in each of the signal lines G1 to G4 (see FIG. 7(b)) match each other, and luminance unevenness is less likely to be caused between the display zone SA1 and the display zone SA2 corresponding to both the sides of the cutout portion NZ, and the main region MP in the inner side with respect to the cutout portion NZ.

Note that when the capacity of the lead wiring lines W1 and W2 is not formed (the lead wiring lines W1 and W2 are formed not to overlap each other), rising and falling of the scanning pulse of each of the signal lines G1 to G4 (see FIG. 7(c)) are steeper than rising and falling of the scanning pulse of the signal line Gn (see FIG. 7(a)), and luminance unevenness may be caused.

FIGS. 7(a) to (c) each indicate the case where the scanning pulse is active High. FIGS. 7(d) to (f) each indicate the case where the scanning pulse is active Low.

Each of the signal lines G1 to G6 and Gn of FIG. 3 is not limited to a scanning signal line, and may be a light emission control signal line (a signal line that supplies a light emission control signal to a subpixel), for example. Additionally, each of the signal lines G1 to G6 and Gn of FIG. 3 may be a data signal line. Further, a configuration in which the lead wiring line W1 is electrically coupled to a scanning signal line and the lead wiring line W2 is electrically coupled to a light emission control signal line is also possible.

Figure 8:
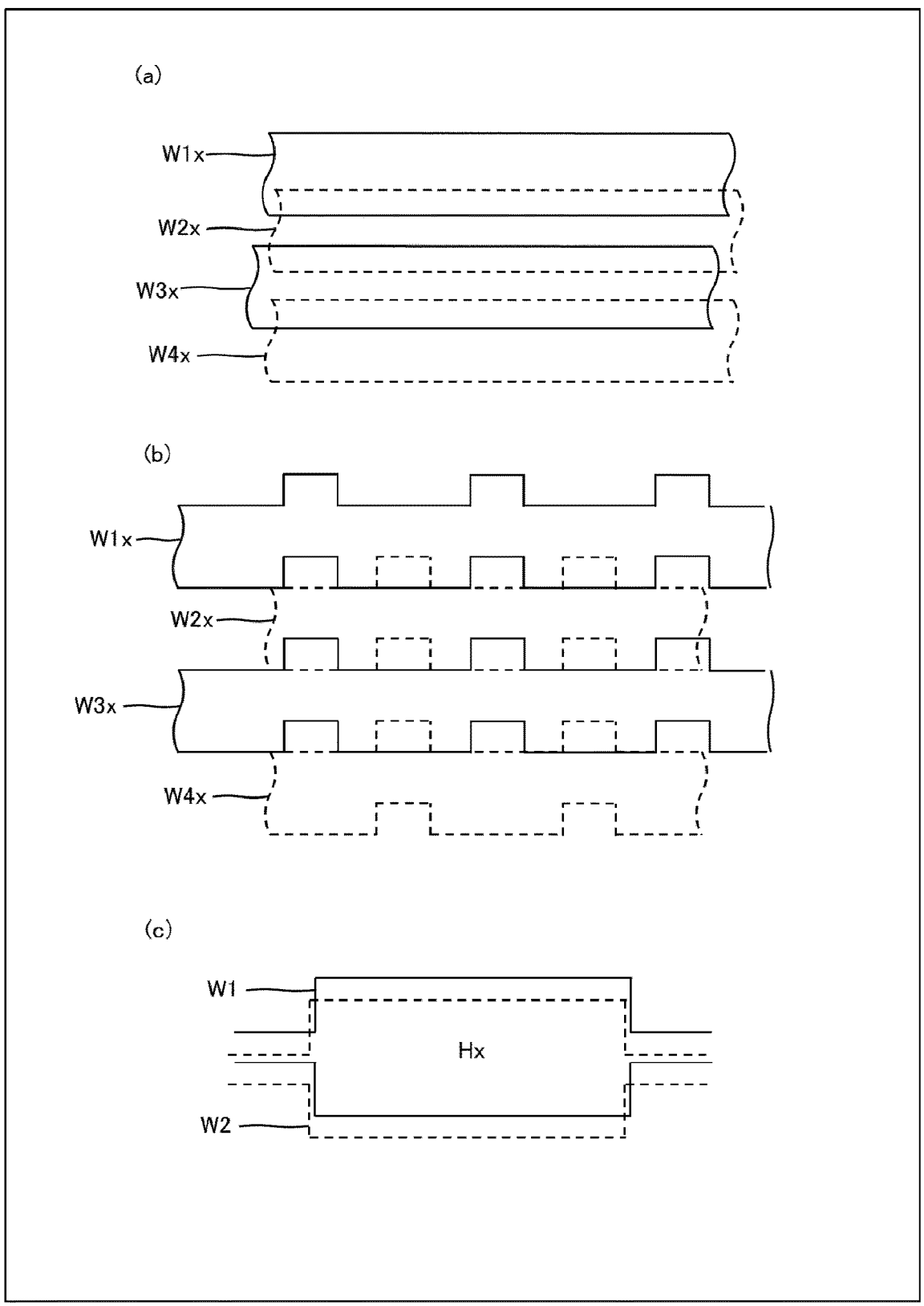
FIGS. 8(a) to (c) are plan views each illustrating a configuration example of a lead wiring line in a periphery of a cutout portion.

FIG. 8 is a plan view illustrating a configuration example of a lead wiring line in a periphery of a cutout portion. In FIG. 5, the bypass portion W2x only overlaps the bypass portion W1x, but the configuration is not limited to this. For example, as illustrated in FIG. 8, a configuration in which the bypass portion W2x overlaps the two bypass portions W1x and W3x is also possible. In this case, the bypass portions W1x, W2x, W3x, and W4x may each have a linear shape as illustrated in FIG. 8(a), or may each have a shape having a recessed portion and a protruding portion in a plane direction as illustrated in FIG. 8(b). In this case, the protruding portion of the lead wiring line W2 overlaps the lead wiring line W1 and the lead wiring line W3.

Note that, as illustrated in FIG. 8(c), a configuration in which each of the lead wiring line W1 and the lead wiring line W2 has a wide portion that is locally wide and the wide portion Hx of the lead wiring line W1 and the wide portion Hx of the lead wiring line W2 are superposed on each other may be adopted.

Figure 9:
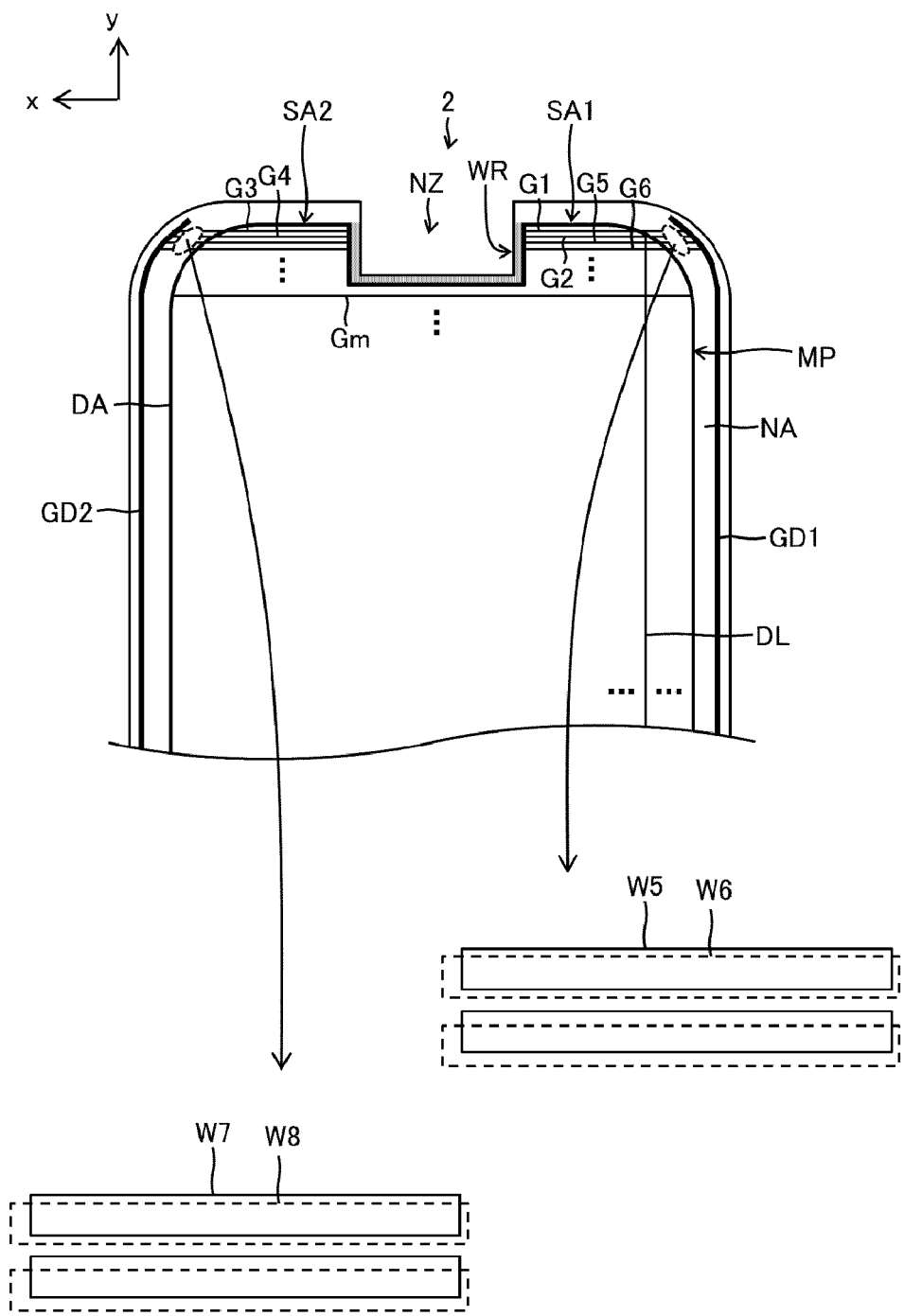
FIG. 9 is a plan view illustrating a configuration example of a periphery of a corner.

FIG. 9 is a plan view illustrating a configuration example of the periphery of the corner of the display region. In FIG. 9, the lead wiring line W5 led to an outer side of an edge of the display zone SA1 and electrically coupled to the signal line G1, and the lead wiring line W6 led to the outer side of the edge of the display zone SA1 and electrically coupled to the signal line G2 are provided. The lead wiring line W5 is provided in the first metal layer (gate layer), the lead wiring line W6 is provided in the second metal layer (intermediate layer), and the lead wiring line W5 and the lead wiring line W6 overlap each other through intermediation of the inorganic insulating film 18 (see FIG. 2).

Additionally, the lead wiring line W7 led to an outer side of an edge of the display zone SA2 and electrically coupled to the signal line G3, and the lead wiring line W8 led to the outer side of the edge of the display zone SA2 and electrically coupled to the signal line G4 are provided. The lead wiring line W7 is provided in the first metal layer (gate layer), the lead wiring line W8 is provided in the second metal layer (intermediate layer), and the lead wiring line W7 and the lead wiring line W8 overlap each other through intermediation of the inorganic insulating film 18 (see FIG. 2).

In this manner, capacity between the lead wiring lines W5 and W6 and capacity between the lead wiring lines W7 and W8 can be applied to the signal lines G1 and G3 and the signal lines G2 and G4, respectively.

In FIG. 9, the lead wiring lines W5 and W6 are disposed between the display zone SA1 and the gate driver GD1, and the lead wiring lines W7 and W8 are disposed between the display zone SA2 and the gate driver GD2. End portions of the gate drivers GD1 and GD2 are desirably curved along round corners of the display zones SA1 and SA2.

Figure 10:
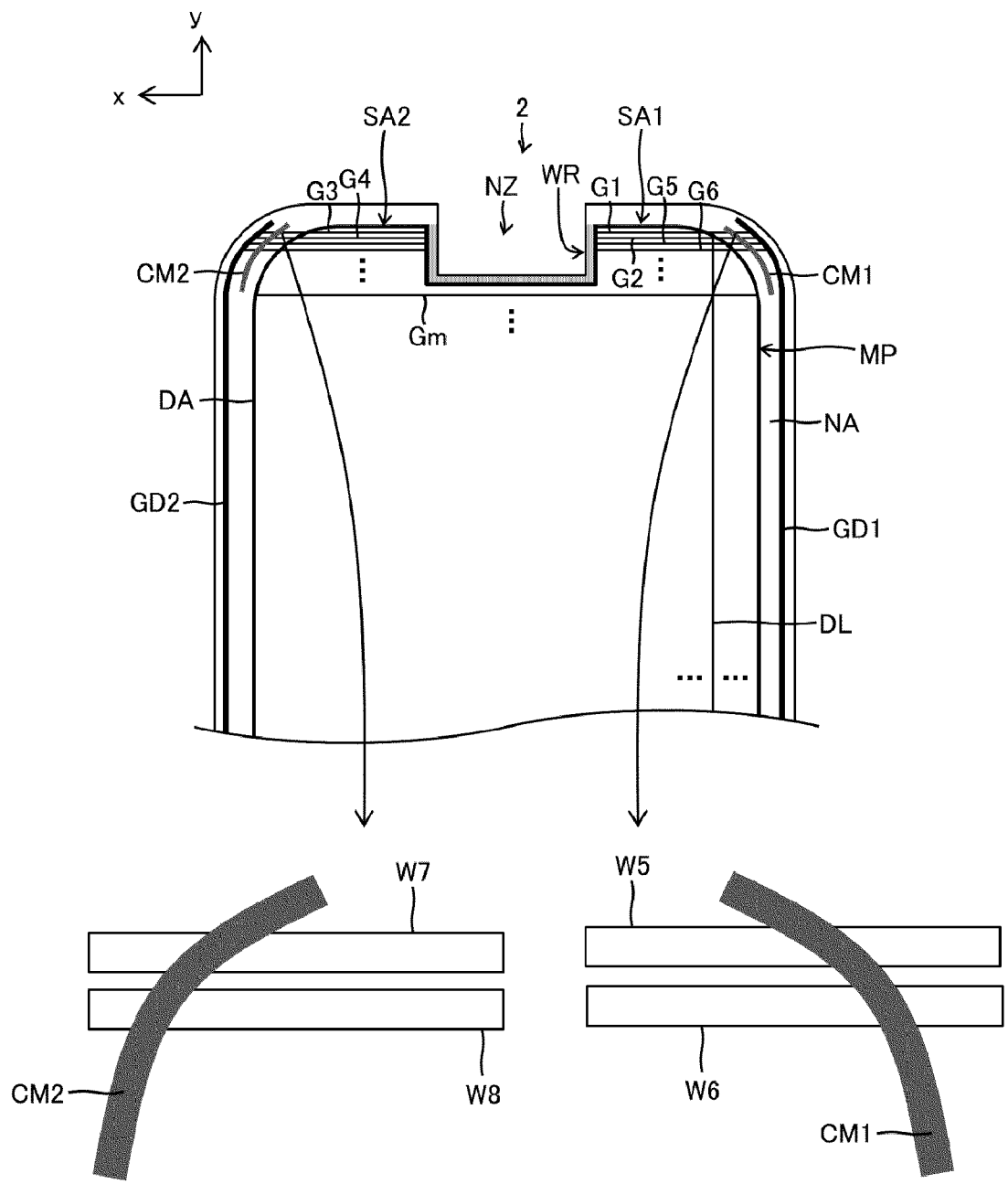
FIG. 10 is a plan view illustrating another configuration example of a periphery of a corner.

FIG. 10 is a plan view illustrating a configuration example of the periphery of the corner of the display region. In FIG. 10, the lead wiring line W5 led to the outer side of the edge of the display zone SA1 and electrically coupled to the signal line G1, the lead wiring line W6 led to the outer side of the edge of the display zone SA1 and electrically coupled to the signal line G2, and a conductor CM1 overlapping the lead wiring line W5 and the lead wiring line W6 through intermediation of the inorganic insulating film 18 are provided. The lead wiring lines W5 and W6 are provided in the first metal layer (gate layer), and the conductor CM1 is provided in the second metal layer (intermediate layer).

Additionally, the lead wiring line W7 led to the outer side of the edge of the display zone SA2 and electrically coupled to the signal line G3, the lead wiring line W8 led to the outer side of the edge of the display zone SA2 and electrically coupled to the signal line G4, and a conductor CM2 overlapping the lead wiring line W7 and the lead wiring line W8 through intermediation of the inorganic insulating film 18 are provided. The lead wiring lines W7 and W8 are provided in the first metal layer (gate layer), and the conductor CM2 is provided in the second metal layer (intermediate layer).

In this manner, capacity between the lead wiring lines W5 and W6 and capacity between the lead wiring lines W7 and W8 can be applied to the signal lines G1 and G3 and the signal lines G2 and G4, respectively.

In FIG. 10, the lead wiring lines W5 and W6 and the conductor CM1 are disposed between the display zone SA1 and the gate driver GD1, and the lead wiring lines W7 and W8 and the conductor CM2 are disposed between the display zone SA2 and the gate driver GD2. As illustrated in FIG. 10, end portions of the gate drivers GD1 and GD2 are desirably curved along the round corners of the display zones SA1 and SA2. The conductors CM1 and CM2 are desirably curved along the round corners of the display zones SA1 and SA2. The conductors CM1 and CM2 may be coupled to a power source (for example, a low voltage power source ELVSS for supply to a subpixel), or may be in an electrically floating state.

Figure 11:
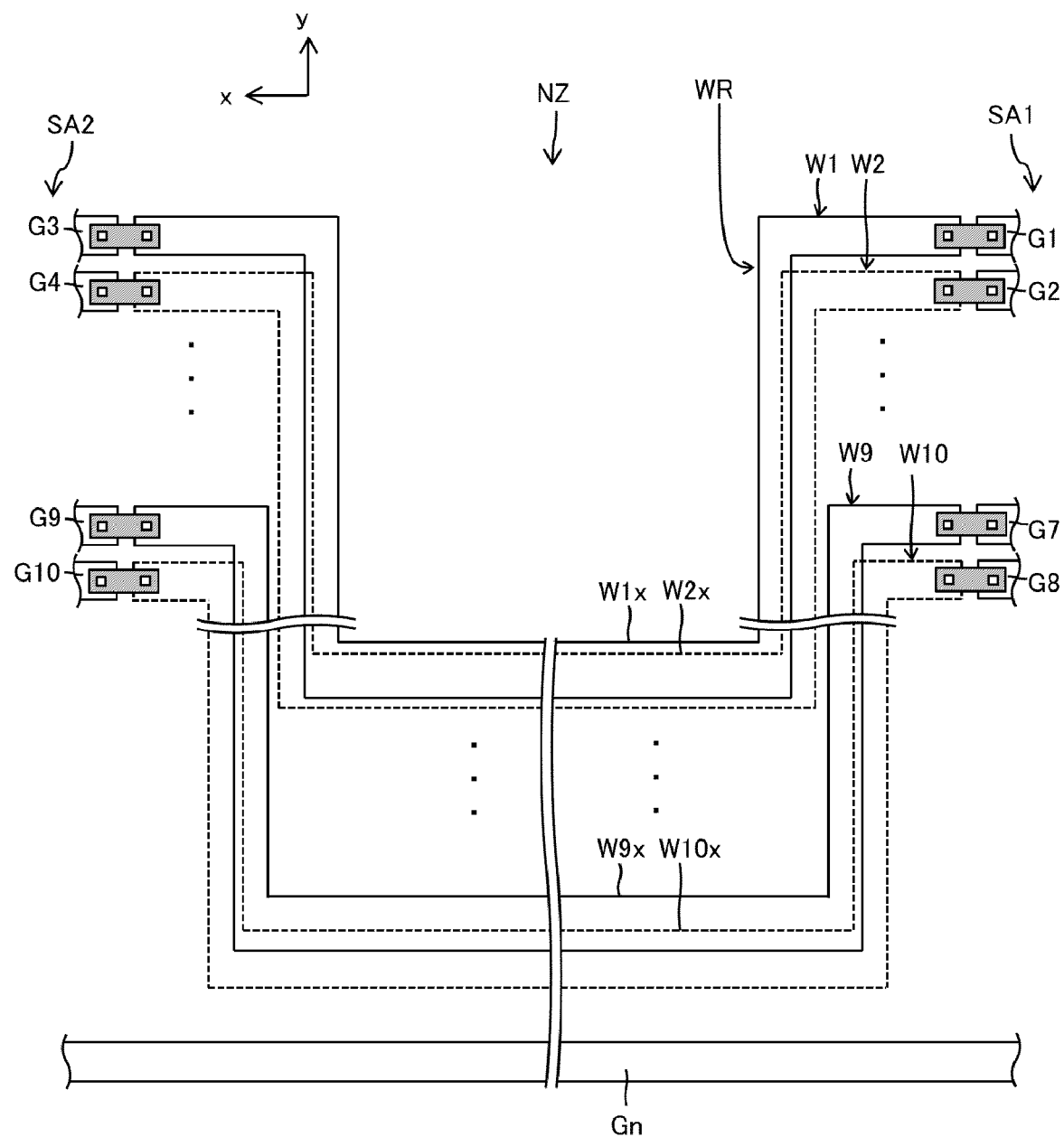
FIG. 11 is a plan view illustrating a configuration example of a periphery of a cutout portion.

FIG. 11 is a plan view illustrating another configuration example of a lead wiring line in a periphery of a cutout portion. When the corners of the display zones SA1 and SA2 are round as illustrated in FIG. 3, in a signal line (for example, signal lines G7 and G8) passing through a lower side (a side close to the signal line Gn) in the display zone SA1, the number of coupled subpixels and the number of the data signal lines DL intersecting are more than those in a signal line (for example, the signal lines G1 and G2) passing through an upper side (a side far from the signal line Gn) in the display zone SA1. Similarly, when the corner of the display zone SA2 is round, in a signal line (for example, the signal lines G7 and G8) passing through a lower side (a side close to the signal line Gn) in the display zone SA2, the number of coupled subpixels and the number of the data signal lines DL intersecting are more than those in a signal line (for example, the signal lines G3 and G4) passing through an upper side (a side far from the signal line Gn) in the display zone SA2.

Thus, as illustrated in FIG. 11, the superposed width (the width: the length in the y direction) of the bypass portion W1x of the lead wiring line W1 coupled to the signal lines G1 and G3 and the bypass portion W2x of the lead wiring line W2 coupled to the signal lines G2 and G4 is larger than the superposed width of a bypass portion W9x of the lead wiring line W9 coupled to signal lines G7 and G9 and a bypass portion W10x of the lead wiring line W10 coupled to signal lines G8 and G10 (that is, the superposed area of the lead wiring line W1 and the lead wiring line W2 is larger than the superposed area of the lead wiring line W9 and the lead wiring line W10). Thus, a load between the signal line in the upper side and the signal line in the lower side in each region can also be balanced.

Figure 12:
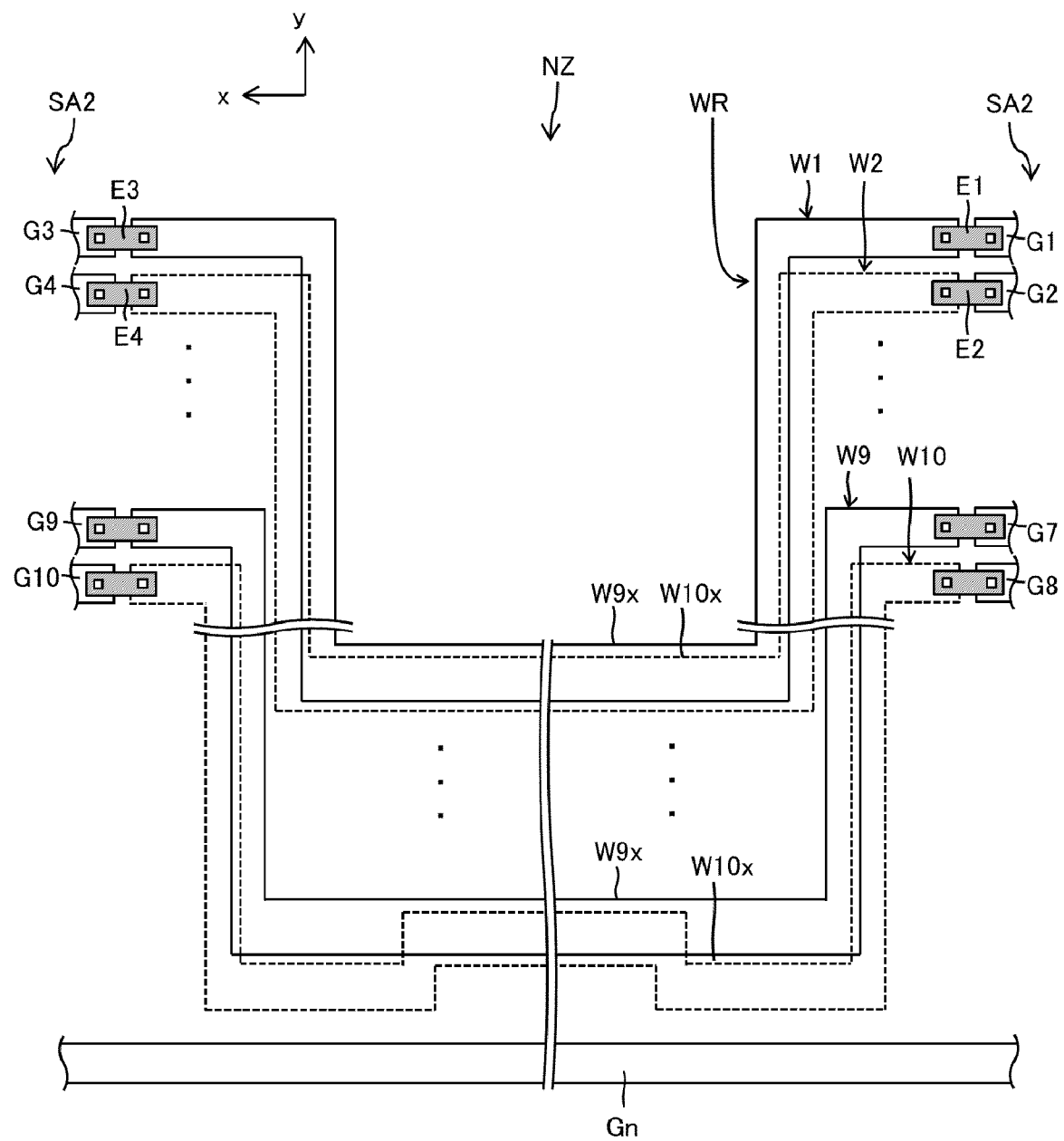
FIG. 12 is a plan view illustrating another configuration example of a periphery of a cutout portion.
Figure 13:
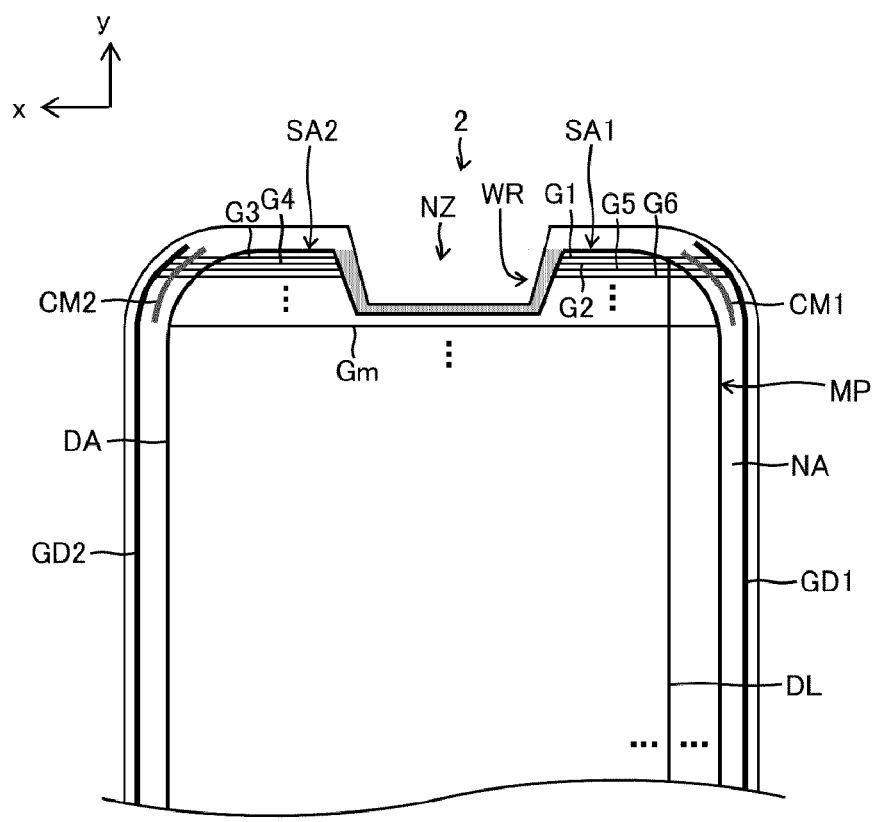
FIG. 13 is a plan view illustrating another configuration example of a periphery of a cutout portion.

FIG. 12 is a plan view illustrating a configuration example of a lead wiring line in a cutout portion. As illustrated in FIG. 12, the superposed distance (the distance: the length in the x direction) of the bypass portion W1x and the bypass portion W2x is different from the superposed distance of the bypass portion W9x and the bypass portion W10x (that is, the superposed area of the lead wiring line W1 and the lead wiring line W2 is different from the superposed area of the lead wiring line W9 and the lead wiring line W10). Thus, a load between the signal line in the upper side and the signal line in the lower side in each region can be balanced. Note that, as illustrated in FIG. 13, even when, due to the shape of the cutout portion NZ (for example, a trapezoidal shape), a load of the signal line in the upper side and a load of the signal line in the lower side are different from each other in both the sides of the cutout portion NZ, the balance can be achieved with use of the configurations of FIG. 11 and FIG. 12.

Figure 14:
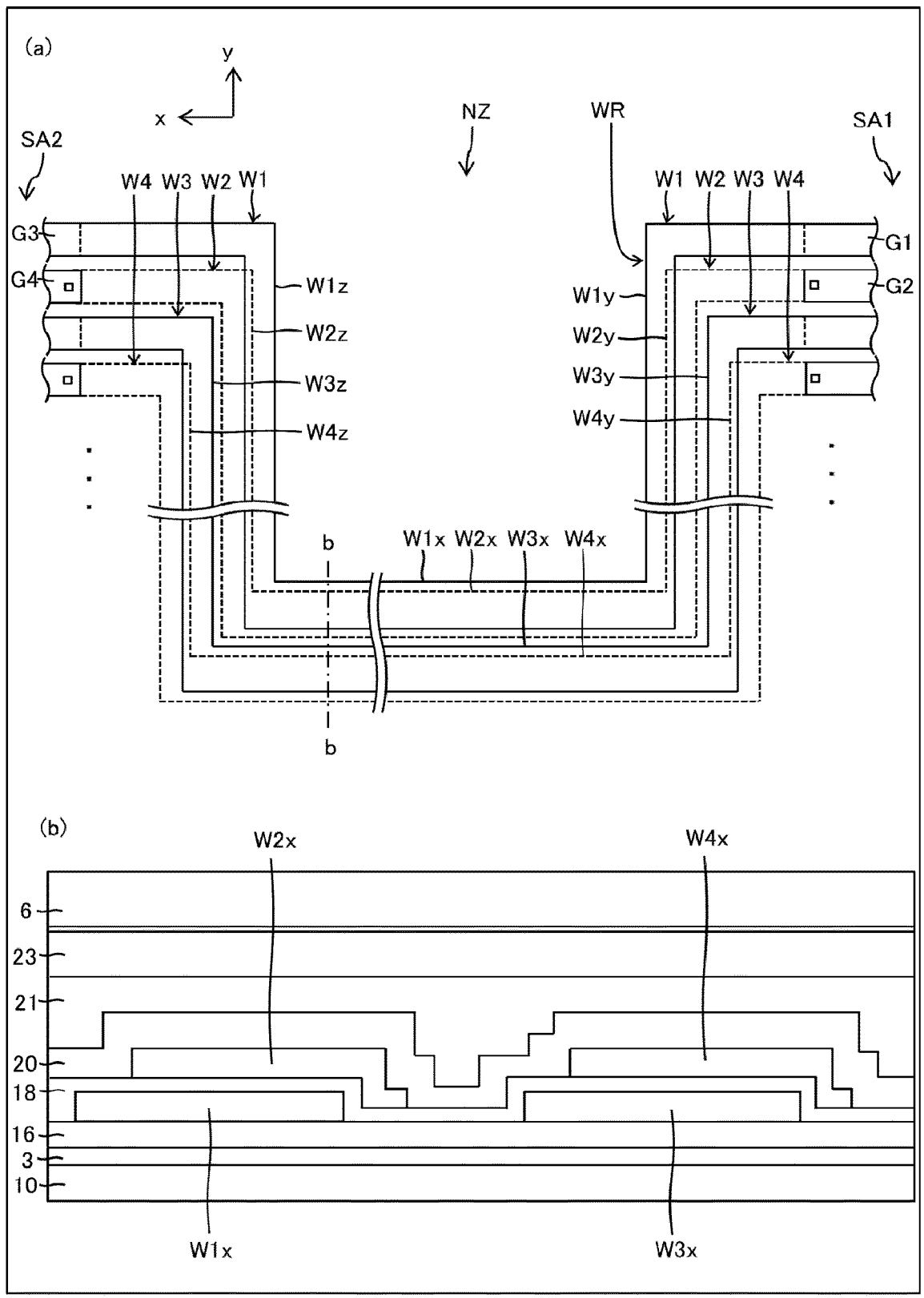
FIG. 14(a) is a plan view illustrating further another configuration example of a periphery of a cutout portion, and (b) is a cross-sectional view taken along b-b of (a).

FIG. 14 is a plan view illustrating another configuration example of a lead wiring line in a periphery of a cutout portion. In FIG. 5, the relay electrodes are provided, but the configuration is not limited to this. As illustrated in FIG. 13, the lead wiring line W1 (the first metal layer) and the signal lines G1 and G3 (the first metal layer) can be connected to each other in the same layer, and the lead wiring line W2 (the second metal layer) and the signal lines G1 and G3 (the first metal layer) can be coupled to each other via the contact holes formed in the inorganic insulating film 18.

Second Embodiment

Figure 15:
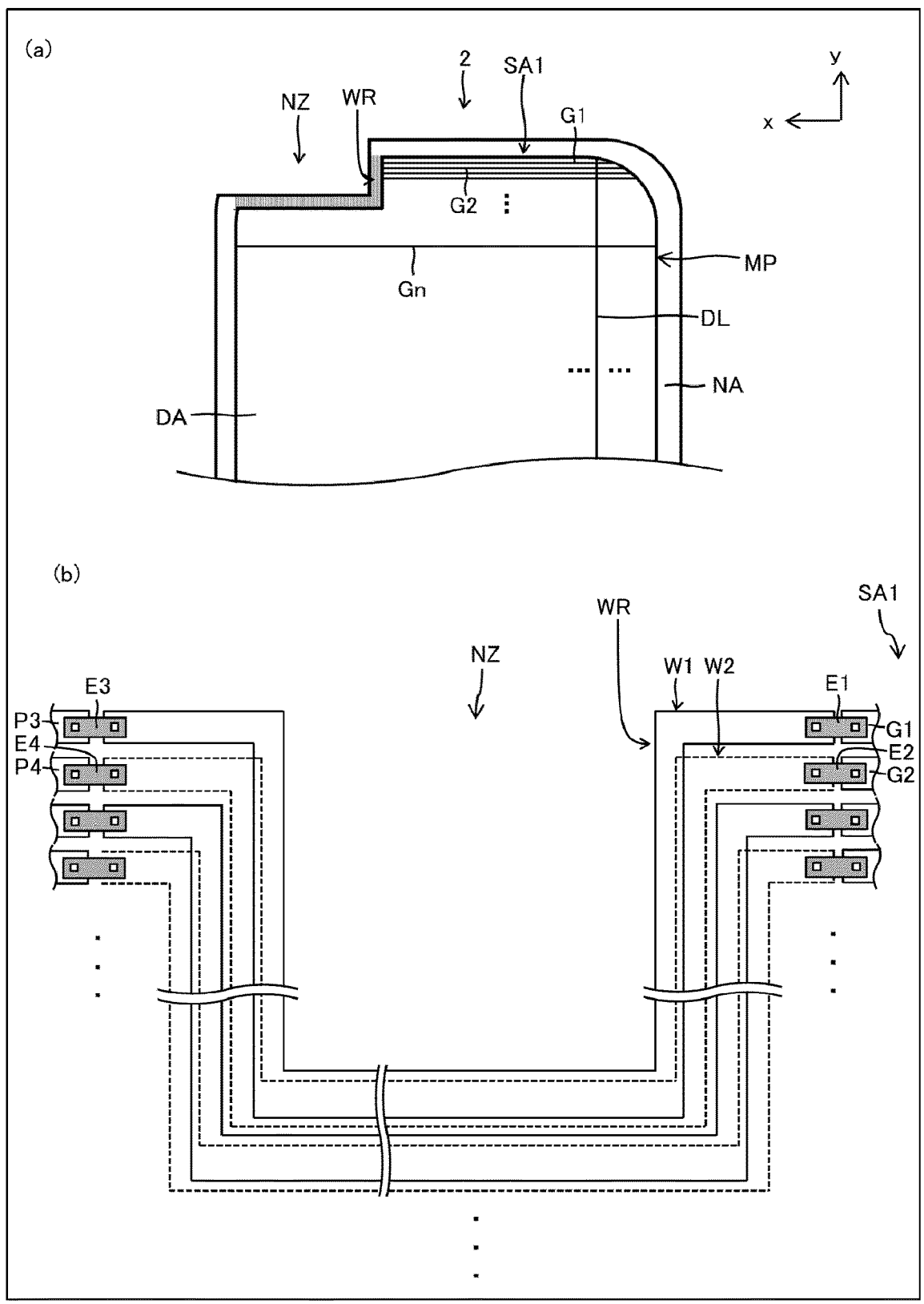
FIG. 15(a) is a plan view illustrating a display device of a second embodiment, and (b) is a plan view illustrating a configuration of a periphery of a cutout portion.

FIG. 15(a) is a plan view illustrating a display device of a second embodiment. FIG. 15(b) is a plan view illustrating a configuration of a periphery of a cutout portion. In FIG. 3, the display regions (the display zone SA1 and the display zone SA2) are present in both the sides of the cutout portion, but the configuration is not limited to this. As illustrated in FIG. 15, a configuration in which a display region (a display zone SA1) is only present in one side of a cutout portion can be adopted.

In FIG. 15, signal lines G1 and G2 passing through the display zone SA1 are respectively coupled to lead wiring lines W1 and W2 disposed in a peripheral edge WR of a cutout portion NZ via relay electrodes E1 and E2, and the lead wiring lines W1 and W2 are respectively coupled to output terminals P3 and P4 of gate drivers (not illustrated) via relay electrodes E3 and E4. Moreover, for example, the lead wiring line W1 (a first metal layer) and the lead wiring line W2 (a second metal layer) overlap each other through intermediation of the inorganic insulating film 18 of FIG. 2. Accordingly, capacity between the lead wiring line W1 and the lead wiring line W2 can be applied to each of the signal lines G1 and G2. A load of a signal line Gn passing through a main region MP, a load of a channel including the signal line G1 and the lead wiring line W1, and a load of a channel including the signal line G2 and the lead wiring line W2 can match.

Third Embodiment

Figure 16:
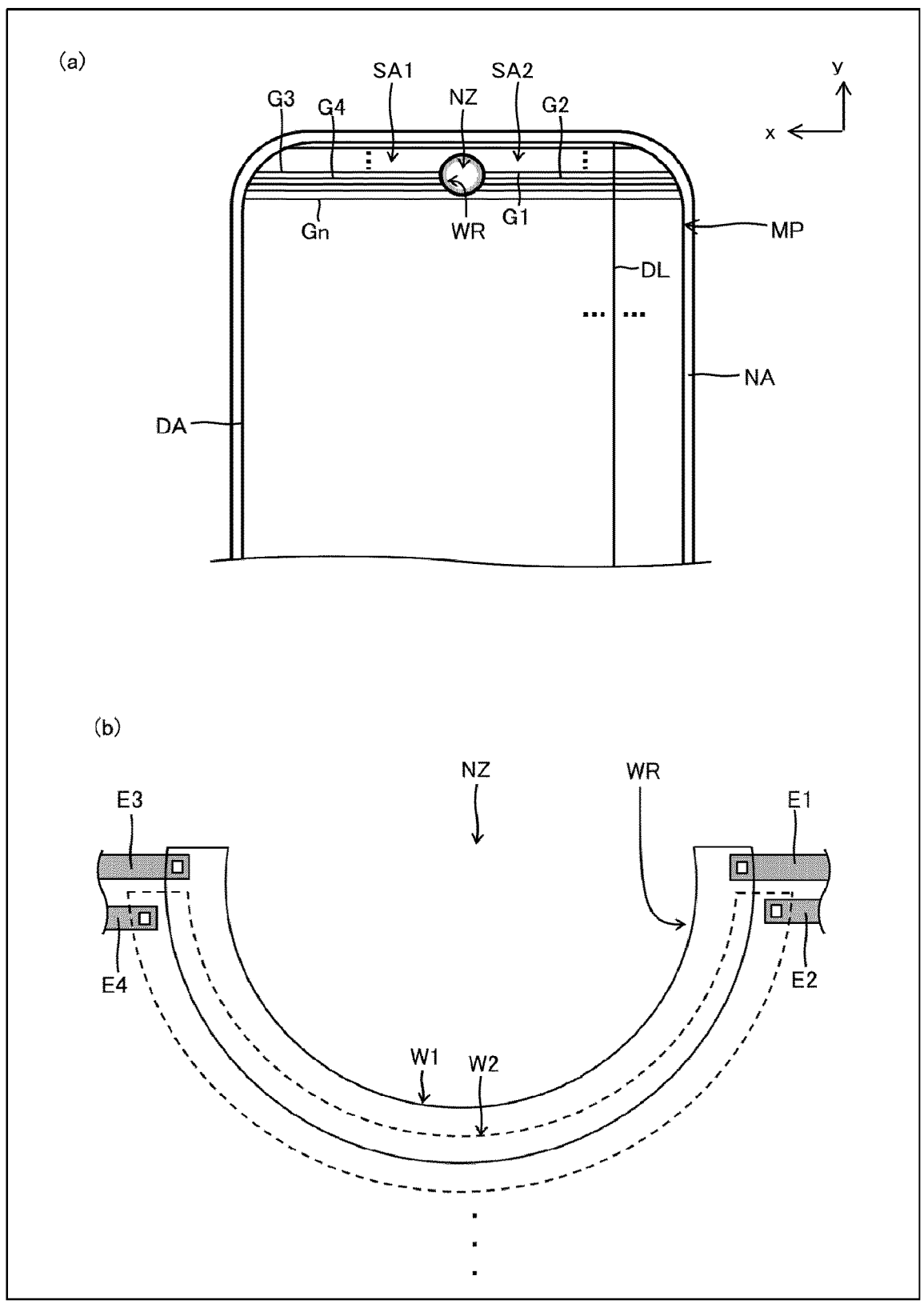
FIG. 16(a) is a plan view illustrating a display device of a third embodiment, and (b) is a plan view illustrating a configuration of a periphery of a cutout portion.

FIG. 16(a) is a plan view illustrating a display device of a third embodiment. FIG. 16(b) is a plan view illustrating a configuration of a periphery of a cutout portion. As illustrated in FIG. 16, a cutout portion NZ having a hole shape may be formed. In FIG. 16, signal lines G1 and G2 passing through a display zone SA1 are respectively coupled to lead wiring lines W1 and W2 having an arc shape and disposed in a peripheral edge WR of the cutout portion NZ, via relay electrodes E1 and E2. The lead wiring lines W1 and W2 are respectively coupled to scanning signal lines G3 and G4 passing through a display zone SA2 via relay electrodes E3 and E4. Moreover, the lead wiring line W1 (a first metal layer) and the lead wiring line W2 (a second metal layer) overlap each other through intermediation of the inorganic insulating film 18 of FIG. 2. Accordingly, capacity between the lead wiring line W1 and the lead wiring line W2 can be applied to each of the signal lines G1 and G2. A load of a signal line Gn passing through a main region MP, a load of a channel including the signal lines G1 and G3 and the lead wiring line W1, and a load of a channel including the signal lines G2 and G4 and the lead wiring line W2 can match.

Supplement

An electro-optical element (an electro-optical element having luminance and transmittance controlled by current) provided in a display device according to the present embodiment is not particularly limited. Examples of the display device according to the present embodiment include an organic Electro Luminescence (EL) display provided with an Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

First Aspect

A display device including:
a display region in which a cutout portion is formed; and
a frame region,
wherein the display region includes
a plurality of data signal lines configured to transmit a data signal,
a plurality of scanning signal lines intersecting the plurality of data signal lines,
a plurality of light emission control signal lines, and
a plurality of subpixel circuits being provided correspondingly to intersection points of the plurality of data signal lines and the plurality of scanning signal lines,
the display device is provided with
a drive circuit being electrically coupled to the plurality of data signal lines,
a drive circuit being electrically coupled to the plurality of scanning signal lines, and
a drive circuit being electrically coupled to the plurality of light emission control signal lines,
the frame region n a periphery of the cutout portion includes
a first lead wiring lines being electrically coupled to a first signal line as one of the plurality of data signal lines, or one of the plurality of scanning signal lines, or one of the plurality of light emission control signal lines, and extending from the display region to the cutout portion, and
a second lead wiring line being electrically coupled to a second signal line as another one of the plurality of data signal lines, or another one of the plurality of scanning signal lines, or another one of the plurality of light emission control signal lines, and extending from the display region to the cutout portion, the second signal line being adjacent to the first signal line, the first lead wiring line is provided in a first metal layer,
the second lead wiring line is provided in a second metal layer being different from the first metal layer, and
the first lead wiring line and the second lead wiring line are superposed on each other through intermediation of an inorganic insulating film.

Second Aspect

The display device, for example according to the first aspect,
wherein, in the frame region between the display region and the cutout portion, the second lead wiring line is electrically coupled to the second signal line provided in the first metal layer.

Third Aspect

The display device, for example according to the first aspect or the second aspect,
wherein, in the display region, the first signal line and the second signal line are formed adjacent to each other in the first metal layer, Fourth Aspect The display device, for example according to the third aspect,
wherein the display region includes a first display zone and a second display zone that face each other across the cutout portion,
a third signal line and a fourth signal line are formed adjacent to each other in the first metal layer,
the first signal line and the second signal line pass through the first display zone, and the third signal line and the fourth signal line pass through the second display zone, and
in the frame region in the periphery of the cutout portion, the first signal line, the first lead wiring line, and the third signal line are electrically coupled to one another, and the second signal line, the second lead wiring line, and the fourth signal line are electrically coupled to one another.

Fifth Aspect

The display device, for example according to the fourth aspect,
wherein the first lead wiring line and the first signal line are electrically coupled to each other via a first relay electrode,
the second lead wiring line and the second signal line are electrically coupled to each other via a second relay electrode,
the first lead wiring line and the third signal line are electrically coupled to each other via a third relay electrode, and
the second lead wiring line and the fourth signal line are electrically coupled to each other via a fourth relay electrode.

Sixth Aspect

The display device, for example according to the fifth aspect,
wherein the first relay electrode, the second relay electrode, the third relay electrode, and the fourth relay electrode are formed in a third metal layer.

Seventh Aspect

The display device, for example according to the third aspect,
wherein a fifth signal line and a sixth signal line that pass through the display region are formed adjacent to each other in the first metal layer,
a third lead wiring line that is electrically coupled to the fifth signal line and is led to the frame region in the periphery of the cutout portion is provided in the first metal layer, and a fourth lead wiring line that is electrically coupled to the sixth signal line and is led to the frame region in the periphery of the cutout portion is provided in the second metal layer.

Eighth Aspect

The display device, for example according to the seventh aspect, wherein the second lead wiring line dose not overlap the third lead wiring line.

Ninth Aspect

The display device, for example according to the eighth aspect, wherein the second lead wiring line overlaps the first lead wiring line and the third lead wiring line through intermediation of the inorganic insulating film, and the third lead wiring line overlaps the second lead wiring line and the fourth lead wiring line through intermediation of the inorganic insulating film.

Tenth Aspect

The display device, for example according to the ninth aspect, wherein a recessed portion and a protruding portion in a plane direction are formed in each of the first lead wiring line, the second lead wiring line, and the third lead wiring line, and the protruding portion of the second lead wiring line overlaps the first lead wiring line and the third lead wiring line.

Eleventh Aspect

The display device, for example according to the fifth aspect, including:

a fifth lead wiring line being led to an outer side of an edge of the first display zone and being electrically coupled to the first signal line; and a sixth lead wiring line being led to the outer side of the edge of the first display zone and being electrically coupled to the second signal line, wherein the fifth lead wiring line is provided in the first metal layer, and the sixth lead wiring line is provided in the second metal layer, and the fifth lead wiring line and the sixth lead wiring line overlap each other through intermediation of the inorganic insulating film.

Twelfth Aspect

The display device, for example according to the eleventh aspect, including:

a seventh lead wiring line being led to an outer side of an edge of the second display zone and being electrically coupled to the third signal line; and an eighth lead wiring line being led to the outer side of the edge of the second display zone and being electrically coupled to the fourth signal line, wherein the seventh lead wiring line is provided in the first metal layer, and the eighth lead wiring line is provided in the second metal layer, and the seventh lead wiring line and the eighth lead wiring line overlap each other through intermediation of the inorganic insulating film.

Thirteenth Aspect

The display device, for example according to the fifth aspect, including:

a fifth lead wiring line being led to an outer side of an edge of the first display zone and being electrically coupled to the first signal line;

a sixth lead wiring line being led to the outer side of the edge of e first display zone and being electrically coupled to the second signal line; and a first conductor overlapping the fifth lead wiring line and the sixth lead wiring line through intermediation of the inorganic insulating film.

Fourteenth Aspect

The display device, for example according to the thirteenth aspect, including:

a seventh wiring line being led to an outer side of an edge of the second display zone and being electrically coupled to the third signal line;

an eighth wiring line being led to the outer side of the edge of the second display zone and being electrically coupled to the fourth signal line; and a second conductor overlapping the seventh lead wiring line and the eighth lead wiring line through intermediation of the inorganic insulating film.

Fifteenth Aspect

The display device, for example according to the third aspect, wherein a seventh signal line and an eighth signal line that pass through the display region are formed adjacent to each other in the first metal layer, a ninth lead wiring line that is electrically coupled to the seventh signal line and is led to the frame region in the periphery of the cutout portion is provided in the first metal layer, a tenth lead wiring line that is electrically coupled to the eighth signal line and is led to the frame region in the periphery of the cutout portion is provided in the second metal layer, the ninth lead wiring line and the tenth lead wiring line overlap each other through intermediation of the inorganic insulating film, and superposed area of the first lead wiring line and the second lead wiring line and superposed area of the ninth lead wiring line and the tenth lead wiring line are different from each other.

Sixteenth Aspect

The display device, for example according to the fifteenth aspect, wherein the number of subpixels being electrically coupled to the first lead wiring line is larger than the number of subpixels being electrically coupled to the ninth lead wiring line, and superposed area of the first lead wiring line and the second lead wiring line is larger than superposed area of the ninth lead wiring line and the tenth lead wiring line.

Seventeenth Aspect

The display device, for example according to the fifteenth aspect, wherein a superposed width of the first lead wiring line and the second lead wiring line and a superposed width of the ninth lead wiring line and the tenth lead wiring line are different from each other.

Eighteenth Aspect

The display device, for example according to the fifteenth aspect, wherein a superposed length of the first lead wiring line and the second lead wiring line and a superposed length of the ninth lead wiring line and the tenth lead wiring line are different from each other.

Nineteenth Aspect

The display device, for example according to any one of the first aspect to the eighteenth aspect, wherein the second metal layer is an upper layer overlying the first metal layer.

Twentieth Aspect

The display device, for example according to the third aspect, wherein, in the frame region in the periphery of the cutout portion, a portion of the first lead wiring line and a portion of the second lead wiring line extend in a first direction and overlap each other through intermediation of the inorganic insulating film.

Twenty-First Aspect

The display device, for example according to the twentieth aspect, wherein the first signal line and the second signal line extend in the first direction.

Twenty-Second Aspect

The display device, for example according to any one of the first aspect to the twenty-first aspect, wherein a terminal section for inputting an external signal is provided along one of two sides facing each other, and the cutout portion is provided along the other of the two sides.

Twenty-Third Aspect

The display device, for example according to any one of the first aspect to the twenty-second aspect, wherein each of the first lead wiring line and the second lead wiring line includes a wide portion that is locally wide, and the wide portion of the first lead wiring line and the wide portion of the second lead wiring line are superposed on each other.

Twenty-Fourth Aspect

The display device, for example according to any one of the first aspect to the twenty-third aspect, wherein the first lead wiring line and the second lead wiring line are led and are adjacent to each other in a plane view, except for a superposed portion of the first lead wiring line and the second lead wiring line.

Twenty-Fifth Aspect

The display device, for example according to any one of the first aspect to the twenty-fourth aspect, wherein each of the first signal line and the second signal line is a scanning signal line.

The invention claimed is:

1. A display device comprising:
a display region in which a cutout portion is formed; and
a frame region,
wherein the display region includes
a plurality of data signal lines configured to transmit a data signal,
a plurality of scanning signal lines intersecting the plurality of data signal lines,
a plurality of light emission control signal lines, and
a plurality of subpixel circuits being provided correspondingly to intersection points of the plurality of data signal lines and the plurality of scanning signal lines,
the display device is provided with
a drive circuit being electrically coupled to the plurality of data signal lines,
a drive circuit being electrically coupled to the plurality of scanning signal lines, and
a drive circuit being electrically coupled to the plurality of light emission control signal lines,
the frame region in a periphery of the cutout portion includes
a first lead wiring line being electrically coupled to a first signal line as one of the plurality of data signal lines, or one of the plurality of scanning signal lines, or one of the plurality of light emission control signal lines, and extending from the display region to the cutout portion, and
a second lead wiring line being electrically coupled to a second signal line as another one of the plurality of data signal lines, or another one of the plurality of scanning signal lines, or another one of the plurality of light emission control signal lines, and extending from the display region to the cutout portion, the second signal line being adjacent to the first signal line,
the first lead wiring line is provided in a first metal layer,
the second lead wiring line is provided in a second metal layer being different from the first metal layer, and
the first lead wiring line and the second lead wiring line are superposed on each other through intermediation of an inorganic insulating film,
wherein, in the display region, the first signal line and the second signal line are formed adjacent to each other in the first metal layer.

2. The display device according to claim 1,
wherein the display region includes a first display zone and a second display zone that face each other across the cutout portion,
a third signal line and a fourth signal line are formed adjacent to each other in the first metal layer,
the first signal line and the second signal line pass through the first display zone, and the third signal line and the fourth signal line pass through the second display zone, and
in the frame region in the periphery of the cutout portion, the first signal line, the first lead wiring line, and the third signal line are electrically coupled to one another, and the second signal line, the second lead wiring line, and the fourth signal line are electrically coupled to one another.

3. The display device according to claim 2,
wherein the first lead wiring line and the first signal line are electrically coupled to each other via a first relay electrode,
the second lead wiring line and the second signal line are electrically coupled to each other via a second relay electrode,
the first lead wiring line and the third signal line are electrically coupled to each other via a third relay electrode, and
the second lead wiring line and the fourth signal line are electrically coupled to each other via a fourth relay electrode.

4. The display device according to claim 3,
wherein the first relay electrode, the second relay electrode, the third relay electrode, and the fourth relay electrode are formed in a third metal layer.

5. The display device according to claim 3, comprising:
a fifth lead wiring line being led to an outer side of an edge of the first display zone and being electrically coupled to the first signal line; and
a sixth lead wiring line being led to the outer side of the edge of the first display zone and being electrically coupled to the second signal line,
wherein the fifth lead wiring line is provided in the first metal layer, and the sixth lead wiring line is provided in the second metal layer, and
the fifth lead wiring line and the sixth lead wiring line overlap each other through intermediation of the inorganic insulating film.

6. The display device according to claim 5, comprising:
a seventh lead wiring line being led to an outer side of an edge of the second display zone and being electrically coupled to the third signal line; and
an eighth lead wiring line being led to the outer side of the edge of the second display zone and being electrically coupled to the fourth signal line,
wherein the seventh lead wiring line is provided in the first metal layer, and the eighth lead wiring line is provided in the second metal layer, and
the seventh lead wiring line and the eighth lead wiring line overlap each other through intermediation of the inorganic insulating film.

7. The display device according to claim 3, comprising:
a fifth lead wiring line being led to an outer side of an edge of the first display zone and being electrically coupled to the first signal line;
a sixth lead wiring line being led to the outer side of the edge of the first display zone and being electrically coupled to the second signal line; and
a first conductor overlapping the fifth lead wiring line and the sixth lead wiring line through intermediation of the inorganic insulating film.

8. The display device according to claim 7, comprising:
a seventh lead wiring line being led to an outer side of an edge of the second display zone and being electrically coupled to the third signal line;
an eighth lead wiring line being led to the outer side of the edge of the second display zone and being electrically coupled to the fourth signal line; and
a second conductor overlapping the seventh lead wiring line and the eighth lead wiring line through intermediation of the inorganic insulating film.

9. The display device according to claim 1,
wherein a fifth signal line and a sixth signal line that pass through the display region are formed adjacent to each other in the first metal layer,
a third lead wiring line that is electrically coupled to the fifth signal line and is led to the frame region in the periphery of the cutout portion is provided in the first metal layer, and
a fourth lead wiring line that is electrically coupled to the sixth signal line and is led to the frame region in the periphery of the cutout portion is provided in the second metal layer.

10. The display device according to claim 9,
wherein the second lead wiring line does not overlap the third lead wiring line.

11. The display device according to claim 10,
wherein the second lead wiring line overlaps the first lead wiring line and the third lead wiring line through intermediation of the inorganic insulating film, and
the third lead wiring line overlaps the second lead wiring line and the fourth lead wiring line through intermediation of the inorganic insulating film.

12. The display device according to claim 11,
wherein a recessed portion and a protruding portion in a plane direction are formed in each of the first lead wiring line, the second lead wiring line, and the third lead wiring line, and the protruding portion of the second lead wiring line overlaps the first lead wiring line and the third lead wiring line.

13. The display device according to claim 1,
wherein a seventh signal line and an eighth signal line that pass through the display region are formed adjacent to each other in the first metal layer,
a ninth lead wiring line that is electrically coupled to the seventh signal line and is led to the frame region in the periphery of the cutout portion is provided in the first metal layer,
a tenth lead wiring line that is electrically coupled to the eighth signal line and is led to the frame region in the periphery of the cutout portion is provided in the second metal layer,
the ninth lead wiring line and the tenth lead wiring line are superposed on each other through intermediation of the inorganic insulating film, and
a superposed area of the first lead wiring line and the second lead wiring line and a superposed area of the ninth lead wiring line and the tenth lead wiring line are different from each other.

14. The display device according to claim 13,
wherein the number of subpixels being electrically coupled to the first lead wiring line is larger than the number of subpixels being electrically coupled to the ninth lead wiring line, and
the superposed area of the first lead wiring line and the second lead wiring line is larger than the superposed area of the ninth lead wiring line and the tenth lead wiring line.

15. The display device according to claim 13,
wherein a superposed width of the first lead wiring line and the second lead wiring line and a superposed width of the ninth lead wiring line and the tenth lead wiring line are different from each other.

16. The display device according to claim 13,
wherein a superposed length of the first lead wiring line and the second lead wiring line and a superposed length of the ninth lead wiring line and the tenth lead wiring line are different from each other.

17. The display device according to claim 1,
wherein, in the frame region in the periphery of the cutout portion, a portion of the first lead wiring line and a portion of the second lead wiring line extend in a first direction and overlap each other through intermediation of the inorganic insulating film.

18. The display device according to claim 17,
wherein the first signal line and the second signal line extend in the first direction.

19. The display device according to claim 1,
wherein each of the first lead wiring line and the second lead wiring line includes a wide portion that is locally wide, and
the wide portion of the first lead wiring line and the wide portion of the second lead wiring line are superposed on each other.

20. The display device according to claim 1,
wherein each of the first signal line and the second signal line is a scanning signal line.

* * * * *